(12) United States Patent
Park

(10) Patent No.: US 7,868,671 B2
(45) Date of Patent: Jan. 11, 2011

(54) DELAY LOCKED LOOP

(75) Inventor: Kwang-Il Park, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 706 days.

(21) Appl. No.: 11/819,070

(22) Filed: Jun. 25, 2007

(65) Prior Publication Data

US 2008/0012615 A1 Jan. 17, 2008

(30) Foreign Application Priority Data

Jul. 3, 2006 (KR) .................. 10-2006-0062110

(51) Int. Cl.
*H03L 7/06* (2006.01)
(52) U.S. Cl. ...................................... 327/158
(58) Field of Classification Search ................ 327/149, 327/158
See application file for complete search history.

(56) References Cited

U.S. PATENT DOCUMENTS

| 6,255,880 | B1 | 7/2001 | Nguyen |  |
|---|---|---|---|---|
| 7,046,059 | B2* | 5/2006 | Kwak | ............ 327/158 |
| 7,057,431 | B2* | 6/2006 | Kwak | ............ 327/158 |
| 7,088,159 | B2* | 8/2006 | Kwak et al. | ............ 327/161 |
| 7,142,026 | B2* | 11/2006 | Kwak | ............ 327/158 |
| 7,161,397 | B2* | 1/2007 | Lee et al. | ............ 327/149 |
| 7,358,784 | B2* | 4/2008 | Kim et al. | ............ 327/158 |
| 2005/0007166 | A1 | 1/2005 | Shin |  |

FOREIGN PATENT DOCUMENTS

| KR | 10-2001-0011503 | 2/2001 |
| KR | 10-2002-0011503 | 2/2001 |
| KR | 10-2004-0064862 | 7/2004 |
| KR | 10-2005-0048838 | 5/2005 |
| KR | 10-2005-0058918 | 6/2005 |
| KR | 10-2006-0041117 | 5/2006 |

OTHER PUBLICATIONS

Korean Decision of Grant dated Jul. 28, 2008 in the corresponding Korean Patent Application No. 10-2006-0062110.

* cited by examiner

*Primary Examiner*—Lincoln Donovan
*Assistant Examiner*—William Hernandez
(74) *Attorney, Agent, or Firm*—Harness, Dickey & Pierce, P.L.C.

(57) ABSTRACT

A delay locked loop may include a period locked loop portion. The period locked loop portion may include a delay. The delay may include an even number of delay cells dependently connected in the form of a ring configured to generate an even number of delay clock signals. Transition of at least one delay clock signal of the even number of delay clock signals is configured to be controlled in response to an activated one first selecting signal of an even number of first selecting signals, and transition of the remaining clock signals is configured to occur in response to the at least one delay clock signal.

29 Claims, 19 Drawing Sheets

DELAY LOCKED LOOP

PRIORITY STATEMENT

This application claims the benefit of priority to Korean Patent Application No. 10-2006-0062110, filed Jul. 3, 2006, in the Korean Intellectual Property Office, the entire contents of which are incorporated herein by reference in their entirety.

BACKGROUND

1. Field

Example embodiments relate to a delay locked loop and, for example, to a delay locked loop which may generate a plurality of clock signals having different phases, a semiconductor memory device including the same, and/or a method of generating a plurality of delay clock signals having different phases.

2. Description of Related Art

A delay locked loop may be employed in devices such as a control device and/or a semiconductor memory device to generate a plurality of clock signals having different phases. Each device may generate an internal clock signal having a higher frequency than an external clock signal using the plurality of clock signals generated from the delay locked loop and output data in response to the internal clock signal.

FIG. 1 is a block diagram illustrating a conventional delay locked loop. The delay locked loop of FIG. 1 may include a period-lock loop portion PL and/or a delay locked loop portion DL. The period locked loop portion PL may include a first phase difference detector 10, a control signal generator 12, and/or a delay 14. The delay locked loop portion DL may include a selecting portion 16, a phase mixer 20, a selecting and weight signal generator 22, a second phase difference detector 24, and/or a delay compensator 26.

Functions of the components of the conventional delay locked loop of FIG. 1 are explained below.

The period locked loop portion PL may receive an input clock signal ECLK to generate n delay clock signals DCLK1 to DCLKn (DCLK) which have the same phase difference therebetween but different phases. For example, each of the n delay clock signals DCLK1 to DCLKn (DCLK) may be out of phase with each of the others, but a phase difference between the n delay clock signals DCLK1 to DCLKn (DCLK) may be constant. The period locked loop portion PL may adjust a period of the n delay clock signals DCLK1 to DCLKn (DCLK) to be the same as a period of the input clock signal ECLK. The delay locked loop portion DL may receive the input clock signal ECLK and/or the n delay clock signals DCLK1 to DCLKn (DCLK) to generate k output clock signals OCLK1 to OCLKk (OCLK) which have the same phase difference therebetween but different phases. The delay locked loop portion DL may adjust a phase of a delay output clock signal OCLK' which is generated by delaying one output clock signal (OCLK) among the k output clock signals OCLK1 to OCLKk to be the same as a phase of the input clock signal ECLK.

The first phase difference detector 10 may detect a phase difference between the input clock signal ECLK and one delay clock signal (DCLK) among the n the delay clock signals DCLK1 to DCLKn to generate first up and down signals UP and DN. For example, the first phase difference detector 10 may generate the first up signal UP if the phase of the input clock signal ECLK is in advance of the phase of the delay clock signal (DCLK) and/or generate the first down signal DN if the phase of the delay clock signal (DCLK) is in advance of the phase of the input clock signal ECLK. The control signal generator 12 may vary a control signal CON in response to the first up and down signals UP and DN. For example, the control signal generator 12 may up-count the control signal CON in response to the first up signal UP and/or down-counts the control signal CON in response to the first down signal DN. The delay 14 may generate the n delay clock signals DCLK1 to DCLKn (DCLK), which have the same phase difference therebetween but difference phases, with a delay time adjusted in response to the control signal CON. The selecting portion 16 may receive the n delay clock signals DCLK1 to DCLKn to generate k first clock signals ICLK1 and k second clock signals ICLK2 which correspond to each other. The phase mixer 20 may mix the k first clock signals ICLK1 and the k second clock signals ICLK2 one by one to generate the k output clock signals OCLK1 to OCLKn (OCLK). The delay compensator 26 may delay the one output clock signals (OCLK) among the k output clock signals OCLK1 to OCLKk to generate the delayed output clock signal OCLK'. A delay time of the delay compensator 26 may be set to a desired time, or alternatively, a time required for data internally generated in response to one of the output clock signals OCLK1 to OCLKk to be output to an external portion. The second phase difference detector 24 may detect a phase difference between the input clock signal ECLK and the delayed output clock signal OCLK' to generate second up and down signals CUP and CDN. For example, the second phase difference detector 24 may generate the second up signal CUP if a phase of the input clock signal ECLK is in advance of a phase of the delayed output clock signal OCLK' and/or generate the down signal CDN if a phase of the delayed output clock signal OCLK' is in advance of a phase of the input clock signal ECLK. The selecting and weight signal generator 22 may perform a counting operation to vary a weight signal W and/or a selecting signal S in response to the second up and down signals CUP and CDN. The selecting and weight signal generator 22 may vary the weight signal W from a lower value to a higher value in response to the second up and down signals CUP and CDN, increase the selecting signal S if the varied weight signal W exceeds the higher value, and/or decrease the selecting signal S if the varied weight signal W is less than the lower value.

FIG. 2 is a circuit diagram illustrating the delay 14 of the conventional delay locked loop of FIG. 1. The delay of FIG. 2 may include a voltage variator 30 and/or a delay circuit 32. The delay circuit 32 may include 8 inverters I1 to I8 which are dependently connected to each other. For example the inverters I1 to I8 may be connected in series and the first inverter I1 in the series may receive the input clock signal.

Functions of the components of FIG. 2 are explained below.

The voltage variator 30 may receive a power supply voltage VCC and/or vary a voltage supplied to the delay circuit 32 in response to the control signal CON. The delay circuit 32 may vary a delay time of the inverters I1 to I8 based on the voltage supplied from the voltage variator 30 to generate 8 clock signals CLK45, CLK90, ..., CLK360 (FCLK), which have the same phase difference therebetween but difference phases. For example, the 8 clock signals CLK45, CLK90, ..., CLK360 (FCLK) may be the 8 clock signals DCLK1 to DCLKn (DCLK).

In the delay locked loop described above, because a rising transition (e.g., a rising edge) and falling transition (e.g., a falling edge) of the n delay clock signals DCLK1 to DCLKn (DCLK) of the delay may occur in response to a rising transition and a falling transition of the input clock signal ECLK, a timing jitter may occur in the input clock signal ECLK. Accordingly, if a duty cycle of the input clock signal ECLK is distorted, the same distortion may appear in the n delay clock signals DCLK1 to DCLKn (DCLK). Accordingly, the duty cycle of the n delay clock signals may not be as exact as desired. For example, the duty cycle of the n delay clock signals may not be exactly 50%. For example, if the input clock signal ECLK is distorted by noise, the n delay clock signals DCLK1 to DCLKn (DCLK) may be distorted, and/or the distortion may appear in the output clock signals OCLK1 to OCLKk (OCLK) generated from the phase mixer.

For example, the conventional delay locked loop may react to distortion of the input clock signal ECLK, and/or the conventional delay locked loop may not generate the n delay clock signals as exact as desired.

SUMMARY

Example embodiments may provide a delay locked loop which is insensitive to distortion of the input clock signal and/or generates a plurality of delay clock signals more stably and exactly.

Example embodiments may provide a semiconductor memory device including a delay locked loop which is insensitive to distortion of the input clock signal/or and generates a plurality of delay clock signals more stably and exactly.

Example embodiments may provide a method for generating a plurality of delay clock signals more stably and exactly.

According to an example embodiment, a delay locked loop may include a period locked loop portion including a delay. The delay may include an even number of delay cells dependently connected in the form of a ring configured to generate an even number of delay clock signals.

According to an example embodiment, transition of at least one delay clock signal of the even number of delay clock signals may be configured to be controlled in response to an activated one first selecting signal of an even number of first selecting signals. Transition of the remaining clock signals may be configured to occur in response to the at least one delay clock signal.

According to an example embodiment, the period locked loop portion may further include a period portion controller. The period portion controller may be configured to compare a phase of an input clock signal and a phase of one delay clock signal of the even number of delay clock signals to generate period portion up and down signals, configured to detect at least one of a rising edge and a falling edge of the input clock signal to generate a pulse signal, and/or configured to vary a first control signal in response to the period portion up and down signals. A delay time of the even number of delay cells may be varied to generate the even number of delay clock signals in response to the first control signal. The even number of delay clock signals may have a same period as a period of the input clock signal.

According to an example embodiment, the period portion controller may include a period portion phase difference detector, a first control signal generator, and/or a pulse generator. The period portion phase difference detector may be configured to compare the phase of the input clock signal and the phase of the one delay clock signal, configured to generate the period portion up signal if the phase of the input clock signal is in advance of the phase of the one delay clock signal, and/or configured to generate the period portion down signal if the phase of the one delay clock signal is in advance of the phase of the input clock signal. The first control signal generator may be configured to increase the first control signal in response to the period portion up signal and/or configured to decrease the first control signal in response to the period portion down signal. The pulse generator may be configured to detect at least one of the rising edge or the falling edge of the input clock signal to generate the pulse signal.

According to an example embodiment, the delay may further include a voltage variator, a first selector, and/or a delay circuit. The voltage variator may be configured to vary a level of a supply voltage in response to the first control signal. The first selector may be configured to select one second control signal of an even number of second control signals and one inverted second control signal among an even number of inverted second control signals in response to the even number of first selecting signals and the pulse signal. The delay circuit may include the even number of delay cells, each of the delay cells may include an inverter, and/or each inverter may include first and second pull-up transistors and first and second pull-down transistors connected between a supply voltage and a ground voltage. The even number of inverted second control signals may be applied to gates of the first pull-up transistors and/or the even number of second control signals may be applied to gates of the pull-down transistors.

According to an example embodiment, the voltage variator may include a voltage divider, a second selector, and/or an amplifier. The voltage divider may include a plurality of resistors serially connected between a power supply voltage and the ground voltage configured to generate a plurality of divided voltages. The second selector may be configured to select and output one divided voltage of the plurality of divided voltages in response to the first control signal. The amplifier may be configured to generate the supply voltage by amplifying a difference between the one divided voltage output from the second selector and the supply voltage.

According to an example embodiment, the delay locked loop may further include a delay locked loop portion. The delay locked loop portion may be configured to delay one output clock signal of an even number of output clock signals in a compensation delay time to generate a delayed output clock signal, configured to compare a phase of the input clock signal and a phase of the delayed output clock signal to generate delay portion up and down signals, configured to vary a selecting and weight control signal in response to the delay portion up and down signals, and/or configured to generate the even number of first selecting signals. The selecting and phase mixing portion may be configured to generate corresponding delay clock signals two by two from the even number of delay clock signals in response to the selecting and weight control signal and/or configured to mix phases of the selected two delay clock signals to generate the even number of output clock signals.

According to an example embodiment, the delay portion controller may include a delay compensator, a delay portion phase difference detector, a selecting and weight signal generator, and/or a selecting signal generator. The delay compensator may be configured to delay the one output clock signal of the even number of output clock signals in the compensation delay time to generate the delayed output clock signal. The delay portion phase difference detector may be configured to compare the phase of the input clock signal and the phase of the delayed output clock signal, configured to generate the delay portion up signal if the phase of the input clock signal is in advance of the phase of the delayed output clock signal, and/or configured to generate the delay portion down signal if the phase of the delayed output clock signal is in advance of the phase of the input clock signal. The selecting and weight signal generator may be configured to increase the selecting and weight control signal in response to the delay portion up signal, configured to reduce the selecting and weight control signal in response to the delay portion down signal, configured to generate a number of bits of the selecting and weight control signal as a weight signal, and/or configured to generate the remaining bits of the selecting and weight control signal as a second selecting signal. The selecting signal generator configured to activate the one first selecting signal of the even number of first selecting signals in response to the delay portion up and down signals.

According to an example embodiment, the selecting and phase mixing portion may include a selecting portion and a phase mixer. The selecting portion may be configured to select corresponding delay clock signals two by two from the even number of delay clock signals and/or configured to output the two corresponding delay clock signals in response to the second selecting signal. The phase mixer may configured to mix the phases of the two corresponding delay clock signals output from the first selector to generate the even number of output clock signals in response to the weight signal.

According to an example embodiment, the period locked loop portion may further include a period portion controller. The period portion controller may be configured to compare a phase of an input clock signal and a phase of one delay clock signal of the even number of delay clock signals to generate period portion up and down signals, configured to detect at least one of a rising edge and a falling edge of the input clock signal to generate a pulse signal, and/or configured to vary a level of a supply voltage in response to the period portion up and down signals. A delay time of the even number of delay cells may be varied to generate the even number of delay clock signals in response to the supply voltage. The even number of delay clock signals may have a same period as a period of the input clock signal.

According to an example embodiment, the period portion controller may include a period portion phase difference detector, a charge pump, and/or a pulse generator. The period portion phase difference detector may be configured to compare the phase of the input clock signal and the phase of the one delay clock signal, configured to generate the period portion up signal if the phase of the input clock signal is in advance of the phase of the one delay clock signal, and/or configured to generate the period portion down signal if the phase of the one delay clock signal is in advance of the phase of the input clock signal. The charge pump may be configured to increase the level of the supply voltage in response to the period portion up signal and/or configured to decrease the level of the supply voltage in response to the period portion down signal. The pulse generator may be configured to detect at least one of the rising edge or the falling edge of the input clock signal to generate the pulse signal.

According to an example embodiment, the delay may further include a first selector and/or a delay circuit. The first selector may be configured to select one control signal of an even number of control signals and one inverted control signal of an even number of inverted control signals in response to the even number of first selecting signals and the pulse signal. The delay circuit may include the even number of delay cells, each of the delay cells may include an inverter, and/or each inverter may include first and second pull-up transistors and first and second pull-down transistors connected between the supply voltage and a ground voltage. The even number of inverted control signals may be applied to gates of the first pull-up transistors and/or the even number of control signals may be applied to gates of the pull-down transistors.

According to an example embodiment, a semiconductor memory device may include a memory cell array, a parallel-to-serial converter, a data output buffer, the delay locked loop, and/or an output data strobe signal generator. The memory cell array may be configured to store parallel data in a write operation and/or configured to output the parallel data in a read operation. The parallel-to-serial converter may be configured to convert the parallel data to generate serial data in the read operation. The data output buffer may be configured to buffer the serial data in response to each of a plurality of output data strobe signals and/or configured to output the buffered serial data to an external portion. The delay locked loop may be configured to receive an external clock signal to generate an even number of output clock signals based on the even number of delay clock signal. The output data strobe signal generator may be configured to combine the even number of output clock signals to generate the plurality of data strobe signals.

According to an example embodiment, transition of at least one delay clock signal of the even number of delay clock signals may be configured to be controlled in response to an activated one first selecting signal of an even number of first selecting signals. Transition of the remaining clock signals may be configured to occur in response to the at least one delay clock signal.

According to an example embodiment, the period locked loop portion may include a period portion controller. The period portion controller may be configured to compare a phase of the external clock signal and a phase of one delay clock signal of the even number of delay clock signals to generate period portion up and down signals, configured to detect at least one of a rising edge and a falling edge of the external clock signal to generate a pulse signal, and/or configured to vary a first control signal in response to the period portion up and down signals. The delay time of the even number of delay cells may be varied to generate an even number of delay clock signals having a same period as a period of the external clock signal in response to the first control signal.

According to an example embodiment, the period portion controller may include a period portion phase difference detector, a first control signal generator, and/or a pulse generator. The period portion phase difference detector may be configured to compare the phase of the external clock signal and the phase of the one delay clock signal, configured to generate the period portion up signal if the phase of the external clock signal is in advance of the phase of the one delay clock signal, and/or configured to generate the period portion down signal if the phase of the one delay clock signal is in advance of the phase of the external clock signal. The first control signal generator may be configured to increase the first control signal in response to the period portion up signal and/or configured to reduce the first control signal in response to the period portion down signal. The pulse generator may be configured to detect at least one of the rising edge or the falling edge of the input clock signal to generate the pulse signal.

According to an example embodiment, the delay may include a voltage variator, a first selector, and/or a delay circuit. The voltage variator may be configured to vary a level of a supply voltage in response to the first control signal. The first selector may be configured to select one second control signal of an even number of second control signals and one inverted second control signal among an even number of inverted second control signals in response to the even number of first selecting signals and the pulse signal. The delay circuit may include the even number of delay cells, each of the delay cells may include an inverter, and/or each inverter may include first and second pull-up transistors and first and second pull-down transistors connected between a supply voltage and a ground voltage. The even number of inverted second control signals may be applied to gates of the first pull-up transistors and/or the even number of second control signals are applied to gates of the pull-down transistors.

According to an example embodiment, the voltage variator may include a voltage divider, a second selector, and/or an amplifier. The voltage divider may include a plurality of resistors serially connected between a power supply voltage and the ground voltage configured to generate a plurality of divided voltages. The second selector may be configured to select and output one divided voltage of the plurality of divided voltages in response to the first control signal. The amplifier may be configured to generate the supply voltage by amplifying a difference between the one divided voltage output from the second selector and the supply voltage.

According to an example embodiment, the delay locked loop may further include a delay locked loop portion. The delay locked loop portion may include a delay portion controller and/or a selecting and phase mixing portion. The delay portion controller may be configured to delay one output clock signal of an even number of output clock signals in a compensation delay time to generate a delayed output clock signal, configured to compare a phase of the external clock signal and a phase of the delayed output clock signal to generate delay portion up and down signals, configured to vary a selecting and weight control signal in response to the delay portion up and down signals, and/or configured to generate the even number of first selecting signals. The selecting and phase mixing portion may be configured to generate corresponding delay clock signals two by two from the even number of delay clock signals in response to the selecting and weight control signal and/or configured to mix phases of the selected two delay clock signals to generate the even number of output clock signals.

According to an example embodiment, the compensation delay time may be a delay time of the data output buffer.

According to an example embodiment, the delay portion controller may include a delay compensator, a delay portion phase difference detector, a selecting a weight signal generator, and/or a selecting signal generator. The delay compensator may be configured to delay the one output clock signal of the even number of output clock signals in the compensation delay time to generate the delayed output clock signal. The delay portion phase difference detector may be configured to compare the phase of the external clock signal and the phase of the delayed output clock signal, configured to generate the delay portion up signal if the phase of the external clock signal is in advance of the phase of the delayed output clock signal, and/or configured to generate the delay portion down signal if the phase of the delayed output clock signal is in advance of the phase of the external clock signal. The selecting and weight signal generator may be configured to increase the selecting and weight control signal in response to the delay portion up signal, configured to reduce the selecting and weight control signal in response to the delay portion down signal, configured to generate a number of bits of the selecting and weight control signal as a weight signal, and/or configured to generate the remaining bits of the selecting and weight control signal as a second selecting signal. The selecting signal generator may be configured to activate the one first selecting signal of the even number of first selecting signals in response to the delay portion up and down signals.

According to an example embodiment, the selecting and phase mixing portion may include a selecting portion and a phase mixer. The selecting portion may be configured to select corresponding delay clock signals two by two from the even number of delay clock signals and/or configured to output the two corresponding delay clock signals in response to the second selecting signal. The phase mixer may be configured to mix the phases of the two corresponding delay clock signals output from the first selector to generate the even number of output clock signals.

According to an example embodiment, the period locked loop portion may further include a period portion controller. The period portion controller may be configured to compare a phase of the external clock signal and a phase of one delay clock signal of an even number of delay clock signals to generate period portion up and down signals, configured to detect at least one of a rising edge and a falling edge of the external clock signal to generate a pulse signal, and configured to vary a level of a supply voltage in response to the period portion up and down signals. The delay time of the even number of delay cells may be varied to generate the even number of delay clock signals in response to the supply voltage. The even number of delay clock signals may have the same period as a period of the external clock signal.

According to an example embodiment, the period portion controller may include a period portion phase detector, a charge pump, and/or a pulse generator. The period portion phase detector may be configured to compare the phase of the external clock signal and the phase of the one delay clock signal, configured to generate the period portion up signal if the phase of the external clock signal is in advance of the phase of the one delay clock signal, and/or configured to generate the period portion down signal if the phase of the one delay clock signal is in advance of the phase of the external clock signal. The charge pump may be configured to increase the level of the supply voltage in response to the period portion up signal and/or to reduce the level of the supply voltage in response to the period portion down signal. The pulse generator may be configured to detect at least one of a rising edge or a falling edge of the external clock signal to generate the pulse signal.

According to an example embodiment, the delay may further include a first selector and/or a delay circuit. The first selector may be configured to select one control signal among an even number of control signals and one inverted control signal among an even number of inverted control signals in response to the even number of first selecting signals and the pulse signal. The delay circuit may include the even number of delay cells, each of the delay cells may include an inverter, and/or each inverter my include first and second pull-up transistors and first and second pull-down transistors connected between the supply voltage and a ground voltage. The even number of inverted control signals may be applied to gates of the first pull-up transistors and/or the even number of control signals are applied to gates of the pull-down transistors.

According to an example embodiment, a method for generating a plurality of clock signals may include controlling transition of at least one delay clock signal of an even number of delay clock signals in response to an activated one first selecting signal of an even number of first selecting signals, and/or transitioning the remaining clock signals in response to the at least one delay clock signal.

According to an example embodiment, the method may further include comparing a phase of an input clock signal and a phase of one delay clock signal of the even number of delay lock signals to generate period up and down signals, detecting at least one of a rising edge and a falling edge of the input clock signal to generate a pulse signal, and/or varying a first control signal in response to the period up and down signals to adjust a delay time of the even number of delay clock signals, the even number of delay clock signals having a same period as a period of the input clock signal.

According to an example embodiment, the method may further include generating the period up signal if the phase of the input clock signal is in advance of the phase of the one delay clock signal and generating the period down signal if the phase of the one delay clock signal is in advance of the phase of the input clock signal, and/or increasing the first control signal in response to the period up signal and reducing the first control signal in response to the period down signal.

According to an example embodiment, the method may further include varying a level of a supply voltage in response to the first control signal, selecting one second control signal of an even number of second control signals and one inverted second control signal among an even number of inverted second control signals in response to the even number of first selecting signals and the pulse signal. The controlling transition of at least one delay clock signal step may be performed in response to the one second control signal and the one inverted second control signal.

According to an example embodiment, the method may further include delaying one output clock signal of an even number of output clock signals in a compensation delay time to generate a delayed output clock signal, comparing a phase of the input clock signal and a phase of the delayed output clock signal to generate delay up and down signals, varying a selecting and weight control signal in response to the delay up and down signals, generating the even number of first selecting signals based on the delay up and down signals, generating corresponding delay clock signals two by two from the even number of delay clock signals in response to the selecting and weight control signal and mixing the phases of the selected two delay clock signals to generate the even number of output clock signals.

According to an example embodiment, the method may further include comparing a phase of an input clock signal and a phase of one delay clock signal of the even number of delay lock signals to generate period up and down signals, detecting at least one of a rising edge and a falling edge of the input clock signal to generate a pulse signal, and/or varying a supply voltage in response to the period up and down signals to adjust a delay time of the even number of delay clock signals, the even number of delay clock signals having a same period as a period of the input clock signal.

According to an example embodiment, the method may further include generating the period up signal if the phase of the input clock signal is in advance of the phase of the one delay clock signal and generating the period down signal if the phase of the one delay clock signal is in advance of the phase of the input clock signal, and/or increasing a level of the supply voltage in response to the period up signal and decreasing the level of the supply voltage in response to the period down signal.

According to an example embodiment, the method may further include selecting one control signal of an even number of control signals and one inverted control signal of an even number of inverted control signals in response to the even number of first selecting signals and the pulse signal. The controlling transition of at least one delay clock signal step may be performed in response to the one control signal and the one inverted control signal.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
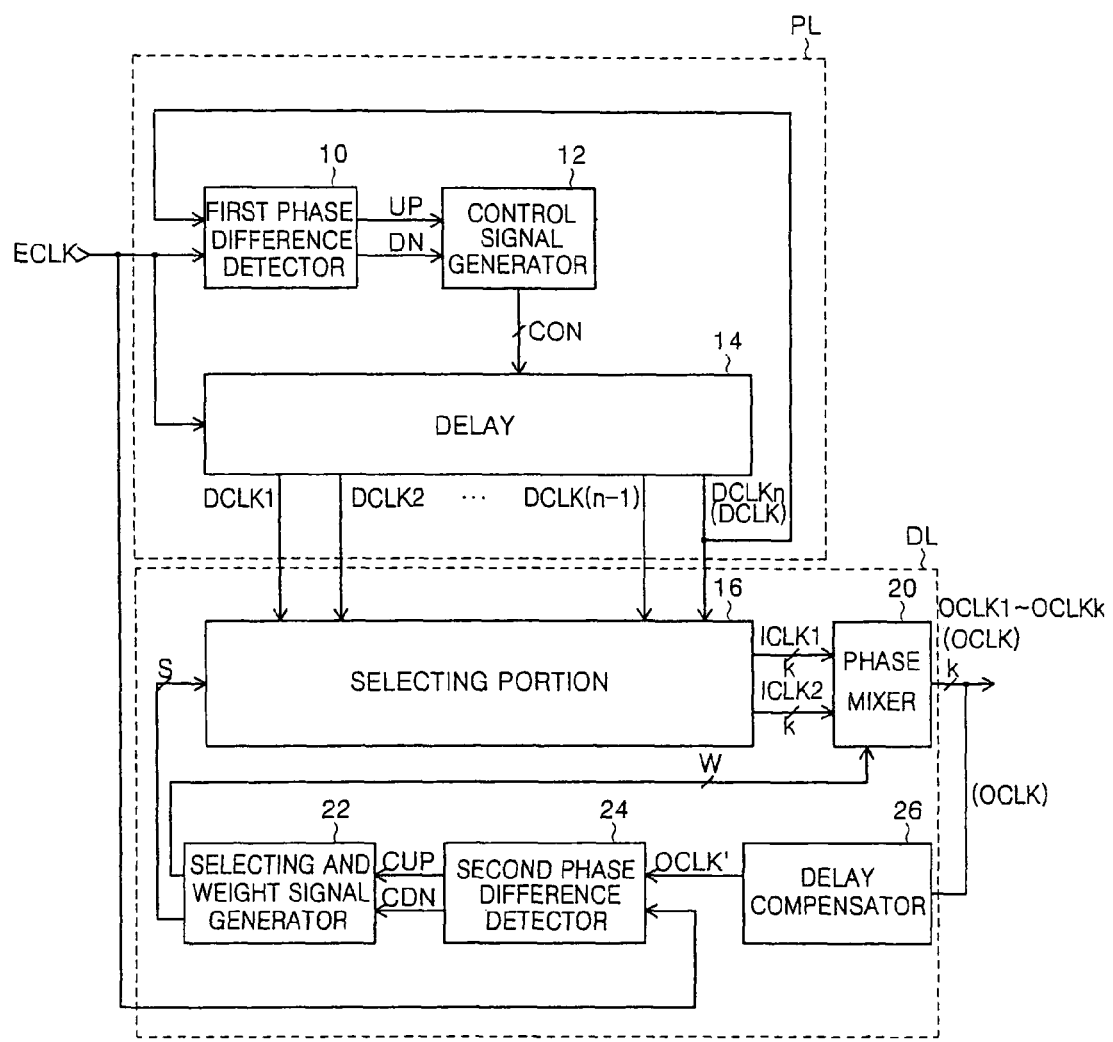
FIG. 1 is a block diagram illustrating a conventional delay locked loop.
Figure 2:
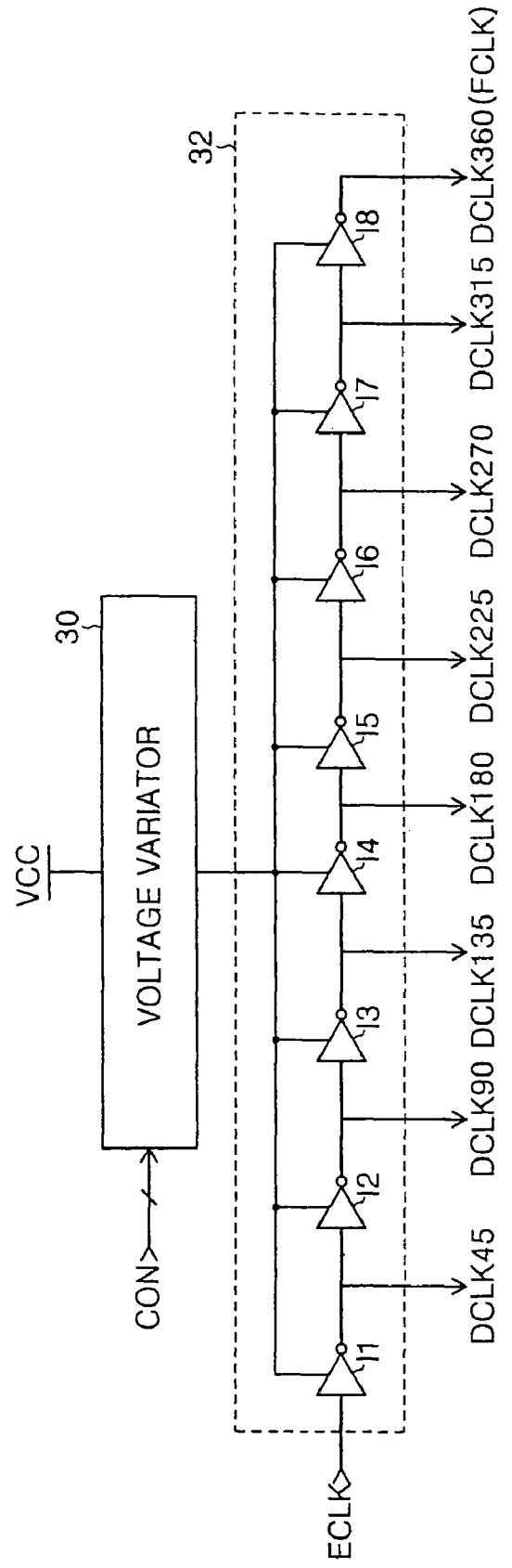
FIG. 2 is a circuit diagram illustrating a delay of the delay locked loop of FIG. 1.

Example embodiments will now be described more fully hereinafter with reference to the accompanying drawings. Embodiments may, however, be embodied in many different forms and should not be construed as being limited to the example embodiments set forth herein. Rather, these example embodiments are provided so that this disclosure will be thorough and complete, and will fully convey the scope to those skilled in the art. In the drawings, the thickness of layers and regions are exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
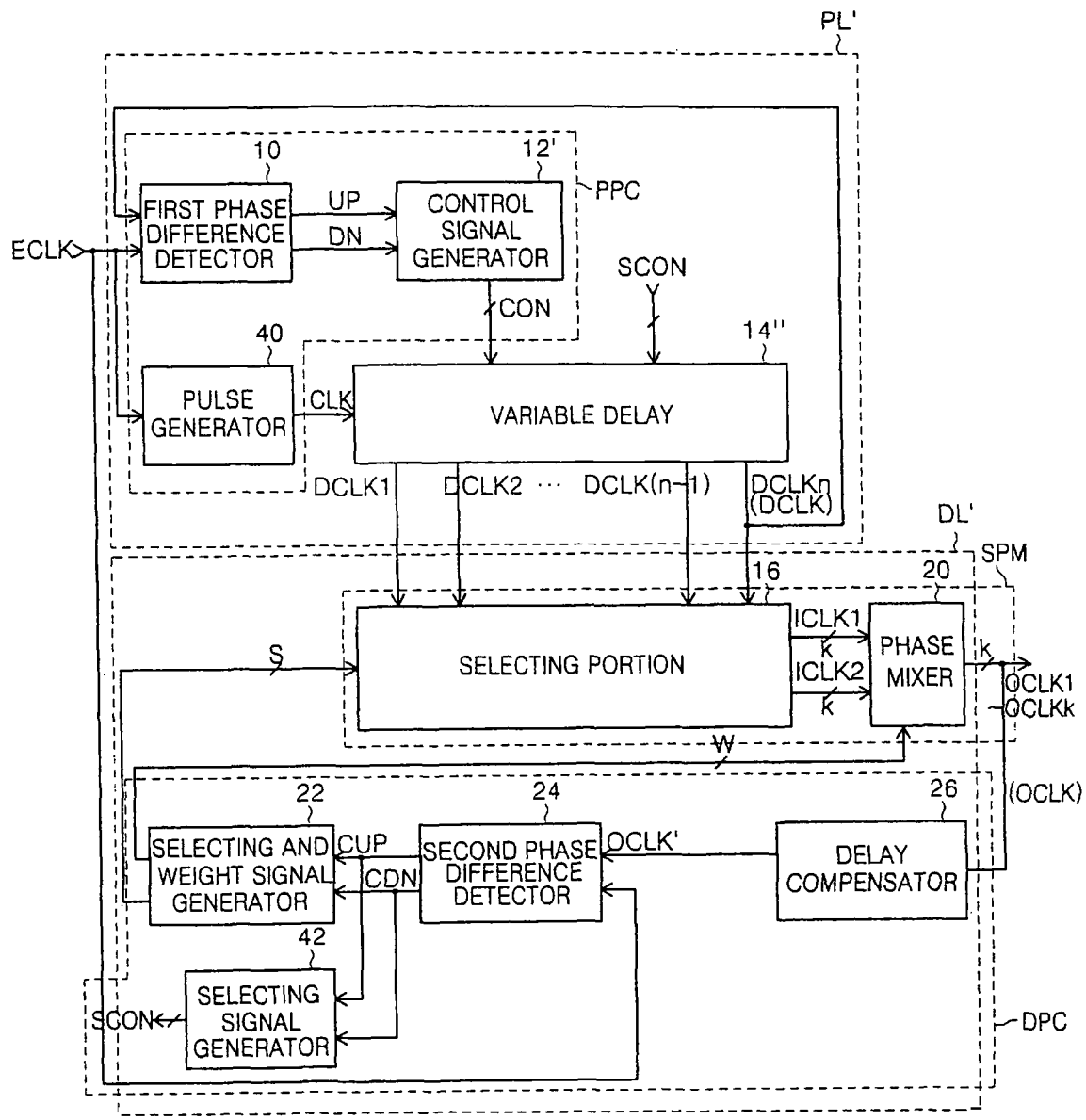
FIG. 3 is a block diagram illustrating a delay locked loop according to an example embodiment.

FIG. 3 is a block diagram illustrating a delay locked loop according to an example embodiment. The period locked loop portion PL and the delay locked loop portion DL of FIG. 1 may be replaced with a period locked loop portion PL' and a delay locked loop portion DL, respectively, in FIG. 3. In the period locked loop portion PL, the delay 14 of the period locked loop portion PL of FIG. 1 may be replaced with a delay 14; and/or the period locked loop portion PL' may include a pulse generator 40. The delay locked loop portion DL' may include a selecting signal generator 42. The first phase difference detector 10, the control signal generator 12, and the pulse generator 40 may comprise a period portion controller PPC. The delay compensator 26, the second phase difference detector 24, the selecting signal generator 42, and/or the selecting and weight signal generator 22 may comprise a delay portion controller DPC. The selecting portion 16 and/or the phase mixer 20 may comprise a selecting and phase mixing portion SPM.

Functions of the components in FIG. 3 may be similar to corresponding components in FIG. 1. Accordingly, while functions of the components of FIG. 3 are explained below, particular attention is paid to those components which are unique to FIG. 3. Namely, the functions of the period locked loop portion PL, the delay locked loop portion DL, the delay 14; the pulse generator 40, and the selecting signal generator 42 are described below.

The pulse generator 40 may detect the rising edge or the falling edge of the input clock signal ECLK to generate a pulse signal CLK. The selecting signal generator 42 may perform an up counting operation in response to the second up signal CUP and a down counting operation in response to the second down signal CDN to generate a selecting signal SCON. The selecting signal SCON may include data of desired, or alternatively, predetermined bits, and/or only one bit of the data may be changed to a high or low level. In the delay 14', a delay time of the n delay clock signals DCLK1 to DCLKn (DCLK) may be adjusted in response to the control signal CON, rising transition (e.g., the rising edge) or falling transition (e.g., the falling edge) of at least one of the n delay clock signals DCLK1 to DCLKn selected in response to the selecting signal SCON may occur if the pulse signal CLK is activated in response to the input clock signal ECLK, the falling transition or the rising transition of the at least one selected delay clock signal may occur if the pulse signal CLK is inactivated, and/or the rising transition or the falling transition of the remaining delay clock signals which are not selected may occur in response to the transition of the selected delay clock signal.

The delay locked loop of FIG. 3 may detect the rising transition or the falling transition of the input clock signal ECLK to generate the pulse signal CLK, vary the delay time of the n delay clock signals DCLK1 to DCLKn (DCLK) in response to the control signal CON, perform transition of at least one among the n delay clock signals DCLK1 to DCLKn (DCLK) in response to the selecting signal SCON and/or the pulse signal CLK, and/or automatically cause the transition of the remaining delay clock signals to occur through the transition of the at least one selected delay clock signal. For example, the n delay clock signals DCLK1 to DCLKn (DCLK) may be adjusted to have different phases but the same phase difference, and the period of the n delay clock signals DCLK1 to DCLKn (DCLK) may become the same as the period of the input clock signal ECLK if the period is locked. For example, each of the n delay clock signals DCLK1 to DCLKn (DCLK) may be out of phase with each of the others, but a phase difference between the n delay clock signals DCLK1 to DCLKn (DCLK) may be constant.

Accordingly, even though the timing jitter may occur in the input clock signal ECLK which may cause the duty cycle of the input clock signal ELCK to be distorted, the duty cycle of the n delay clock signals DCLK1 to DCLKn (DCLK) may be exactly compensated, for example to 50%, by the delay 14', so that distortion of the input clock signal ECLK is not shown in the n delay clock signals DCLK1 to DCLKn (DCLK).

Figure 4A:
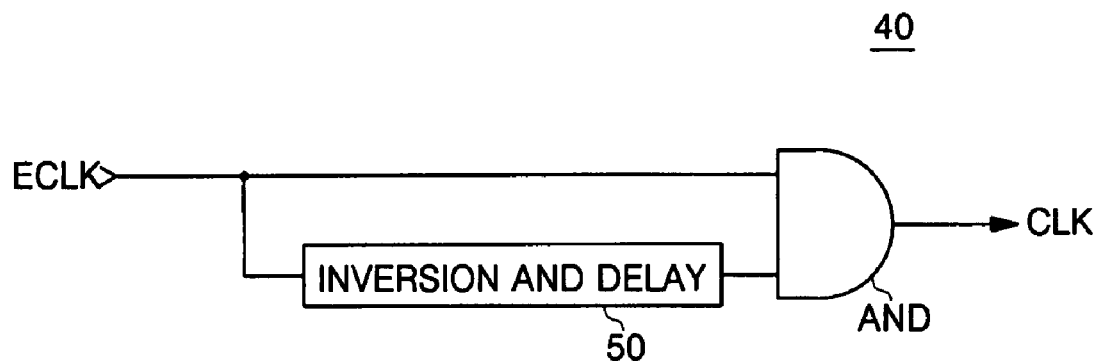
FIG. 4a is a circuit diagram illustrating a pulse generator of the delay locked loop of FIG. 3 according to an example embodiment.

FIG. 4a is a circuit diagram illustrating the pulse generator 40 of the delay locked loop of FIG. 3 according to an example embodiment. The pulse generator of FIG. 4a may include an inversion and delay 50 and/or an AND gate AND.

Functions of the components of FIG. 4a are explained below.

The inversion and delay 50 may invert and delay the input clock signal ECLK to generate an inverted and delayed input clock signal. The AND gate AND may logical-product the input clock signal ELCK and the inverted and delayed input clock signal to generate the pulse signal CLK.

The pulse generator of FIG. 4a may detect the rising edge of the input clock signal ECLK to generate the pulse signal CLK with a positive pulse having a pulse width corresponding to the delay time of the inversion and delay 50.

Figure 4B:
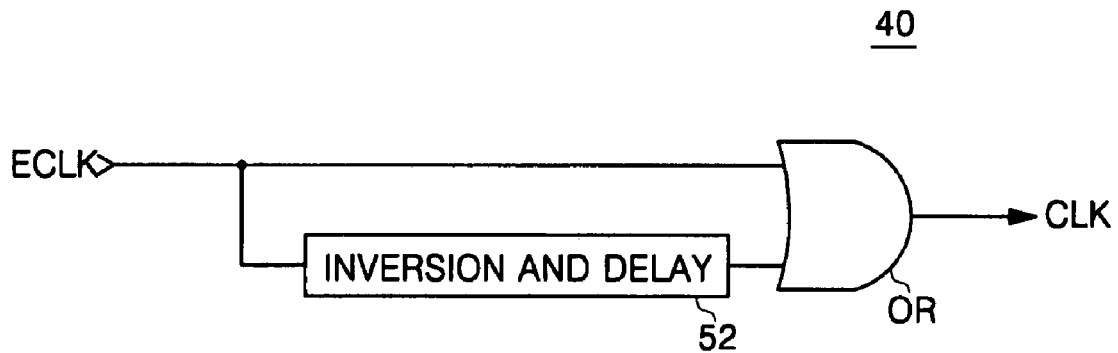
FIG. 4b is a circuit diagram illustrating a pulse generator according to another example embodiment.

FIG. 4b is a circuit diagram illustrating a pulse generator 40 according to another example embodiment. The pulse generator of FIG. 4b may include an inversion and delay 52 and/or an OR gate OR.

Functions of the components of FIG. 4b are explained below.

The inversion and delay 50 may invert and delay the input clock signal ECLK to generate the inverted and delayed input clock signal. The OR gate OR may logical-sum the input clock signal ECLK and the inverted and delayed input clock signal to generate the pulse signal CLK.

The pulse generator of FIG. 4b may detect the falling edge of the input clock signal ECLK to generate the pulse signal CLK with a negative pulse having a pulse width corresponding to the delay time of the inversion and delay 52.

Figure 5:
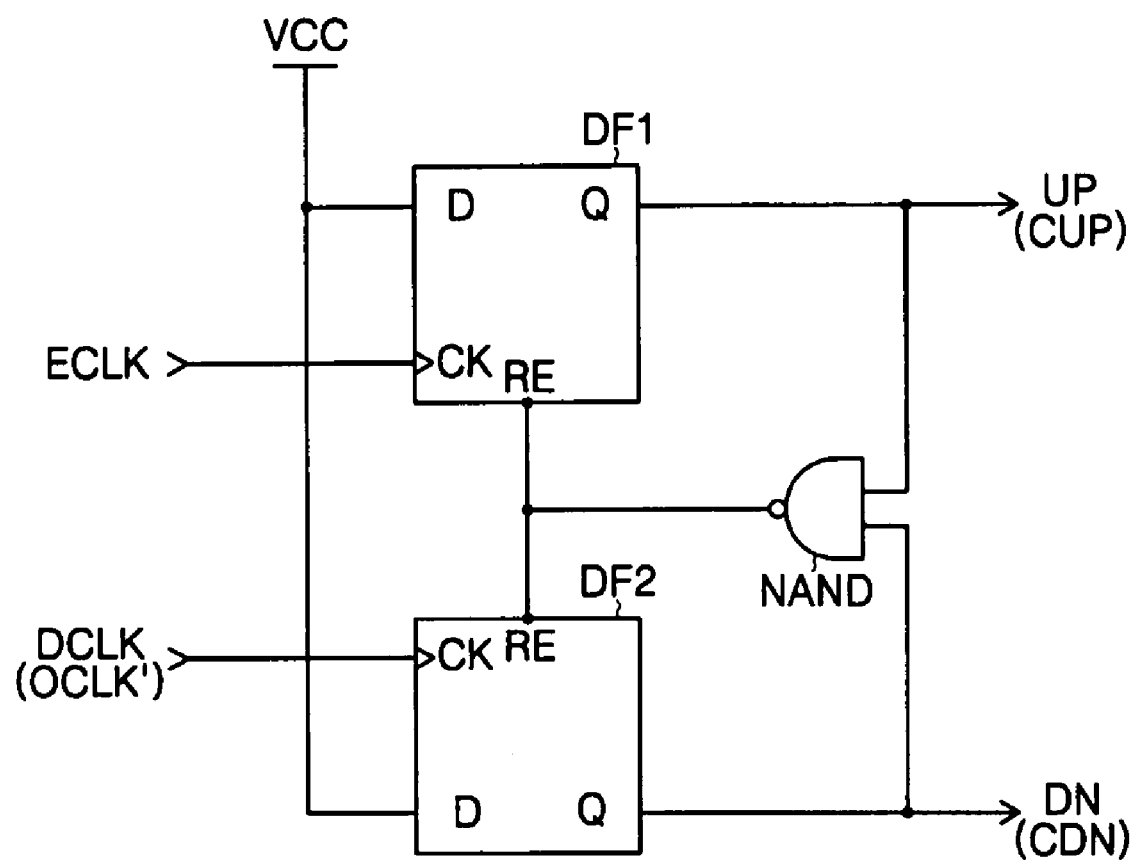
FIG. 5 is a circuit diagram illustrating a first or second phase difference detector of the delay locked loop of FIG. 3.

FIG. 5 is a circuit diagram illustrating the first or second phase difference detector 10 or 24 of the delay locked loop of FIG. 3. The first or second phase difference detector of FIG. 5 may include D flip flops DF1 and DF2 and/or a NAND gate NAND. An input of each of the D flip flops DF1 and DF2 may receive the power supply voltage VCC and/or the outputs of the D flip flops DF1 and DF2 may be received by the NAND gate NAND.

Functions of the components of FIG. 5 are explained below.

The D flip flop DF1 may generate the first up signal UP (or the second up signal CUP) having a high level at the rising edge of the input clock signal ECLK and/or may be reset to generate the first up signal UP (or the second up signal CUP) having a low level if an output signal of the NAND gate NAND becomes a low level. The D flip flop DF2 may generate the first down signal DN (or the second down signal CDN) having a high level at the rising edge of the delay clock signal (DCLK) (or at the rising edge of the output clock signal OCLK) and/or may be reset to generate the first down signal DN (or the second down signal CDN) having a low level if the output signal of the NAND gate NAND becomes a low level. The NAND gate NAND may generate the first up and down signals UP and DN (or the second up and down signals CUP and CDN) having a low level if both of the first up and down signals UP and DN (or if both of the second up and down signals CUP and CDN) become a high level.

Figure 6:
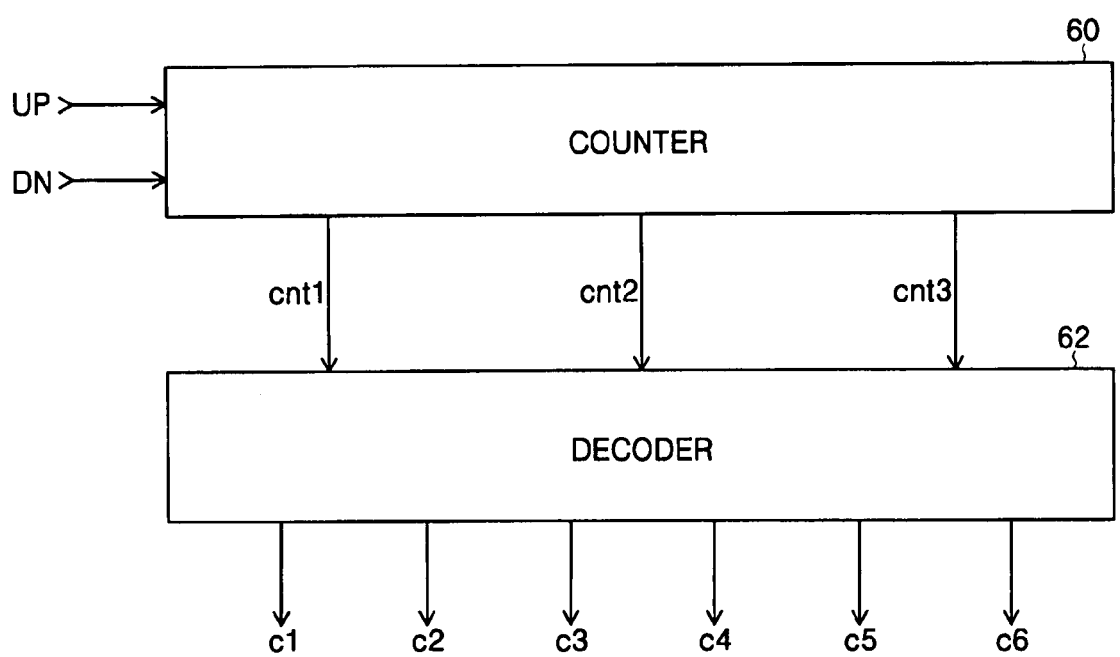
FIG. 6 is a schematic diagram illustrating a control signal generator of the delay locked loop of FIG. 3.

FIG. 6 is a schematic diagram illustrating the control signal generator 12 of the delay locked loop of FIG. 3. The control signal generator of FIG. 6 may include a counter 60 and/or a decoder 62.

FIG. 6 shows the control signal generator 12 which may generate a 6-bit control signal CON (e.g., c1 to c6).

Functions of the components of FIG. 6 are explained below.

The counter 60 may perform up counting in response to the up signal UP and down counting in response to the down signal DN to generate a 3-bit counting signal cnt1 to cnt3. The decoder 62 may decode the 3-bit counting signal cnt1 to cnt3 to make one bit of the 6-bit control signal CON (e.g., one bit among bits c1 to c6) become a high level.

For example, the counter 60 may be configured to count the 3-bit counting signal cnt1 to cnt3 from "000" to "101" in response to the up signal UP and to count the counting signal cnt1 to cnt3 from "101" to "000" in response to the down signal DN. The decoder 82 may be realized by a typical decoder. For example, the decoder 62 may be configured to logically combine the counting signal cnt1 to cnt3 and an inverted signal of the counting signal cnt1 to cnt3 to make the control signal c1 become a high level if the counting signal cnt1 to cnt3 is "000" to make the control signal c2 become a high level if the counting signal cnt1 to cnt3 is "001" to make the control signal c3 become a high level if the counting signal cnt1 to cnt3 is "010", to make the control signal c4 become a high level if the counting signal cnt1 to cnt3 is "011", to make the control signal c5 become a high level if the counting signal cnt1 to cnt3 is "100", and/or to make the control signal c6 become a high level if the counting signal cnt1 to cnt3 is "101".

Figure 7:
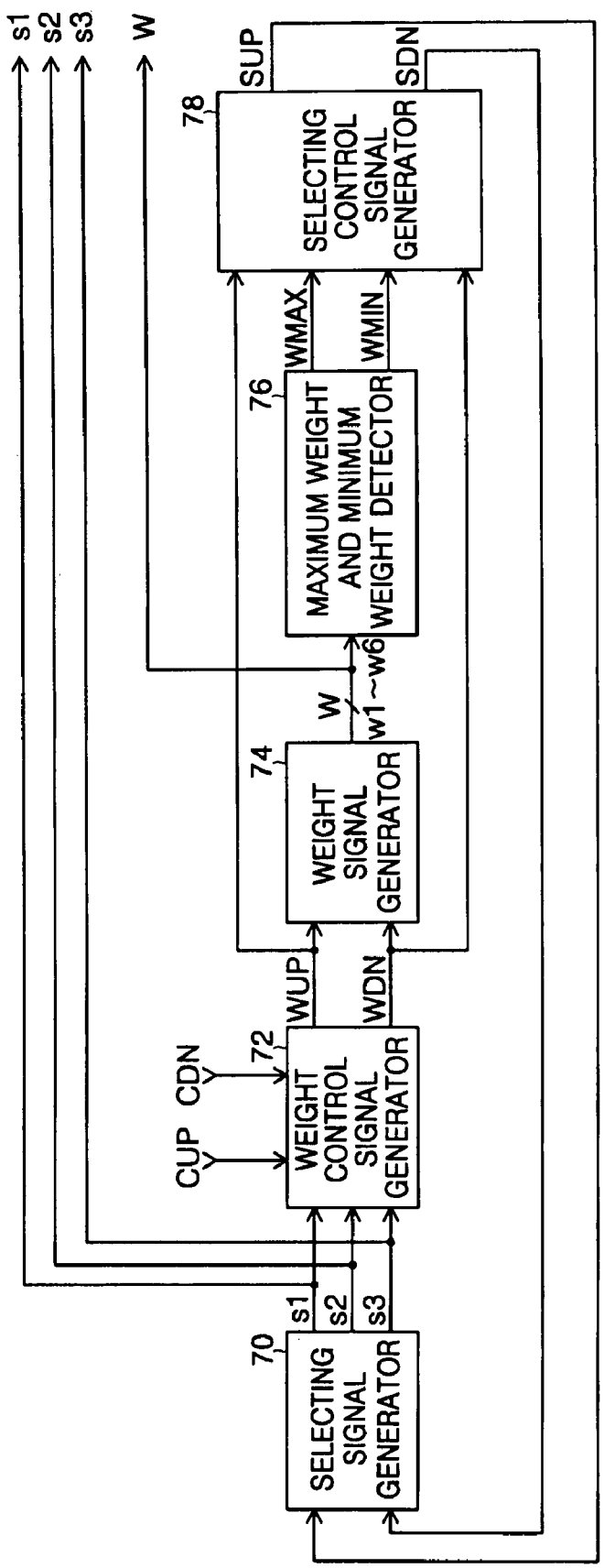
FIG. 7 is a block diagram illustrating a selecting and weight signal generator of the delay locked loop of FIG. 3.

FIG. 7 is a block diagram illustrating the selecting and weight signal generator 22 of the delay locked loop of FIG. 3. The selecting and weight signal generator 22 of FIG. 7 may include a selecting signal generator 70, a weight control signal generator 72, a weight signal generator 74, a maximum weight and minimum weight detector 76, and/or a selecting control signal generator 78.

FIG. 7 shows the selecting and weight signal generator 24 which may generate a 3-bit selecting signal s1 to s3 and/or a 6-bit weight signal W (e.g., w1 to w6).

Functions of the components of FIG. 7 are explained below.

The selecting signal generator 70 may perform up counting in response to a selecting signal up signal SUP and/or down counting in response to a selecting signal down signal SDN to generate the selecting signal s1 to s3. For example, the selecting signal generator 70 may be a counter which performs the up counting to repetitively count from "000" to "111" in response to the up signal SUP and performs the down counting to repetitively count from "111" to "000". The weight control signal generator 72 may generate a weight up signal WUP or a weight down signal WDN in response to the second up signal CUP or the second down signal CDN output from the second phase difference detector 24 if the variation of the selecting signal s1 to s3 is detected. For example, the weight control signal generator 72 may generate the weight up signal WUP in response to the second up signal CUP and the weight down signal WDN in response to the second down signal CDN if the selecting signal s1 to s3 is "000" or "111", and/or generate the weight down signal WDN in response to the second up signal CUP and the weight up signal WUP in response to the second down signal CDN if the selecting signal s1 to s3 is "001" "010" "011", "100" "101" or "110" The weight signal generator 74 may perform up counting in response to the weight up signal WUP and down counting in response to the weight down signal WDN to generate a weight signal W (e.g., w1 to w6) comprising desired, or alternatively, predetermined-bit data. The maximum weight and minimum weight detector 76 detects a higher value of the weight signal W to generate a maximum weight detecting signal WMAX and/or detect a lower value of the weight signal W to generate a minimum weight detecting signal WMIN. For example, the maximum weight and minimum weight detector 76 may generate the maximum weight detecting signal WMAX if the weight signal W has data all of which are "1" (for example, w1 to w6 are "111111") and/or generate the minimum weight detecting signal WMIN if the weight signal W has data all of which are "0" (for example, w1 to 6 are "000000"). The selecting control signal generator 78 may generate the selecting signal up signal SUP and/or the selecting signal down signal SDN in response to the maximum and minimum weight detecting signals WMAX and WMIN and/or the weight up and down signals WUP and WDN.

Figure 8:
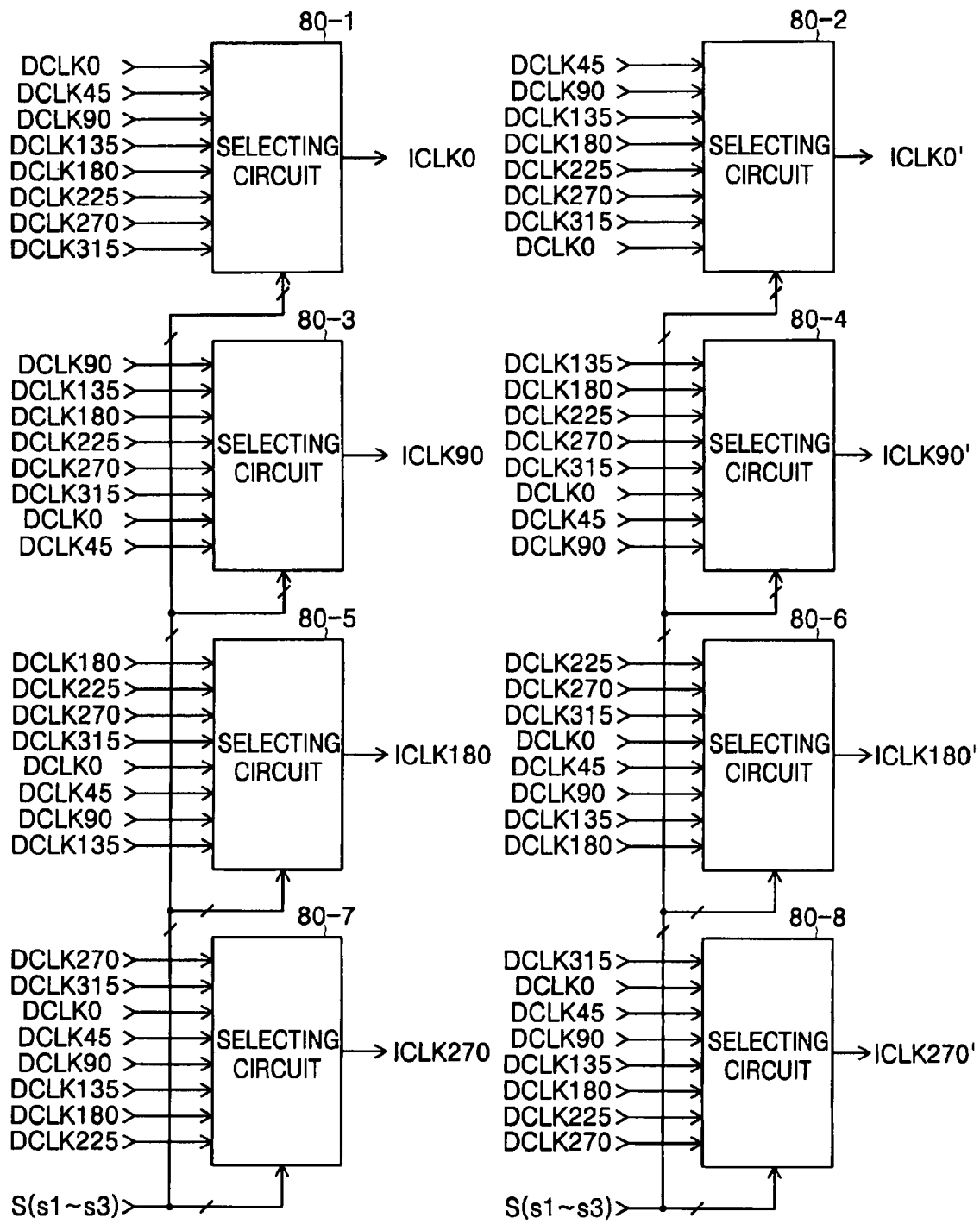
FIG. 8 is a block diagram illustrating a selecting portion of the delay locked loop of FIG. 3.

FIG. 8 is a block diagram illustrating the selecting portion 16 of the delay locked loop of FIG. 3. The selecting portion 16 of FIG. 8 may include selecting circuits 80-1 to 80-8.

The selecting circuits 80-1 and 80-2 may respectively receive the delay clock signals DCLK0, DCLK45, DCLK90, DCLK135, DCLK180, DCLK225, DCLK270, and DCLK315, which have a phase difference of 45° therebetween, and/or select two clock signals having a phase difference of 45° therebetween in response to the 3-bit selecting signal S (s1 to s3) to generate clock signals ICLK0 and ICLK0', respectively. The selecting circuits 80-3 and 80-4 may respectively receive the delay clock signals DCLK0, DCLK45, DCLK90, DCLK135, DCLK180, DCLK225, DCLK270, and DCLK315, which have a phase difference of 45° therebetween, and/or select the clock signals ICLK0 and ICLK0' having a phase difference of 45° therebetween and two clock signals having a phase difference of 90° therebetween in response to the 3-bit selecting signal S (s1 to s3) to generate clock signals ICLK90 and ICLK90', respectively. The selecting circuits 80-5 and 80-6 may respectively receive the delay clock signals DCLK0, DCLK45, DCLK90, DCLK135, DCLK180, DCLK225, DCLK270, and DCLK315, which have a phase difference of 45° therebetween, and/or select the clock signals ICLK0 and ICLK0' having a phase difference of 45° therebetween and two clock signals having a phase difference of 180° therebetween in response to the 3-bit selecting signal S to generate clock signals ICLK180 and ICLK180' respectively. The selecting circuits 80-7 and 80-8 may respectively receive the delay clock signals DCLK0, DCLK45, DCLK90, DCLK135, DCLK180, DCLK225, DCLK270, and DCLK315, which have a phase difference of 45° therebetween, and/or select the clock signals ICLK0 and ICLK0' having a phase difference of 45° therebetween and two clock signals having a phase difference of 2700 therebetween in response to the 3-bit selecting signal S to generate clock signals ICLK270 and ICLK270' respectively.

The selecting portion 16 of FIG. 8 may generate the two clock signals ICLK0 and ICLK0', ICLK90 and ICLK90', ICLK180 and ICLK180', and ICLK270 and ICLK270', each pair having a phase difference of 45° therebetween, if a phase difference between the clock signals ICLK0, ICLK90, ICLK180, and ICLK270 is 90°, and a phase difference between the clock signals ICLK0', ICLK90', ICLK180', and ICLK270' is also 90°.

The selecting portion 16 of FIG. 8 is configured to generate the 8 clock signals, but it may be configured to generate 16 clock signals. For example, the selecting portion may be configured to generate more or less than 8 clock signals.

Figure 9:
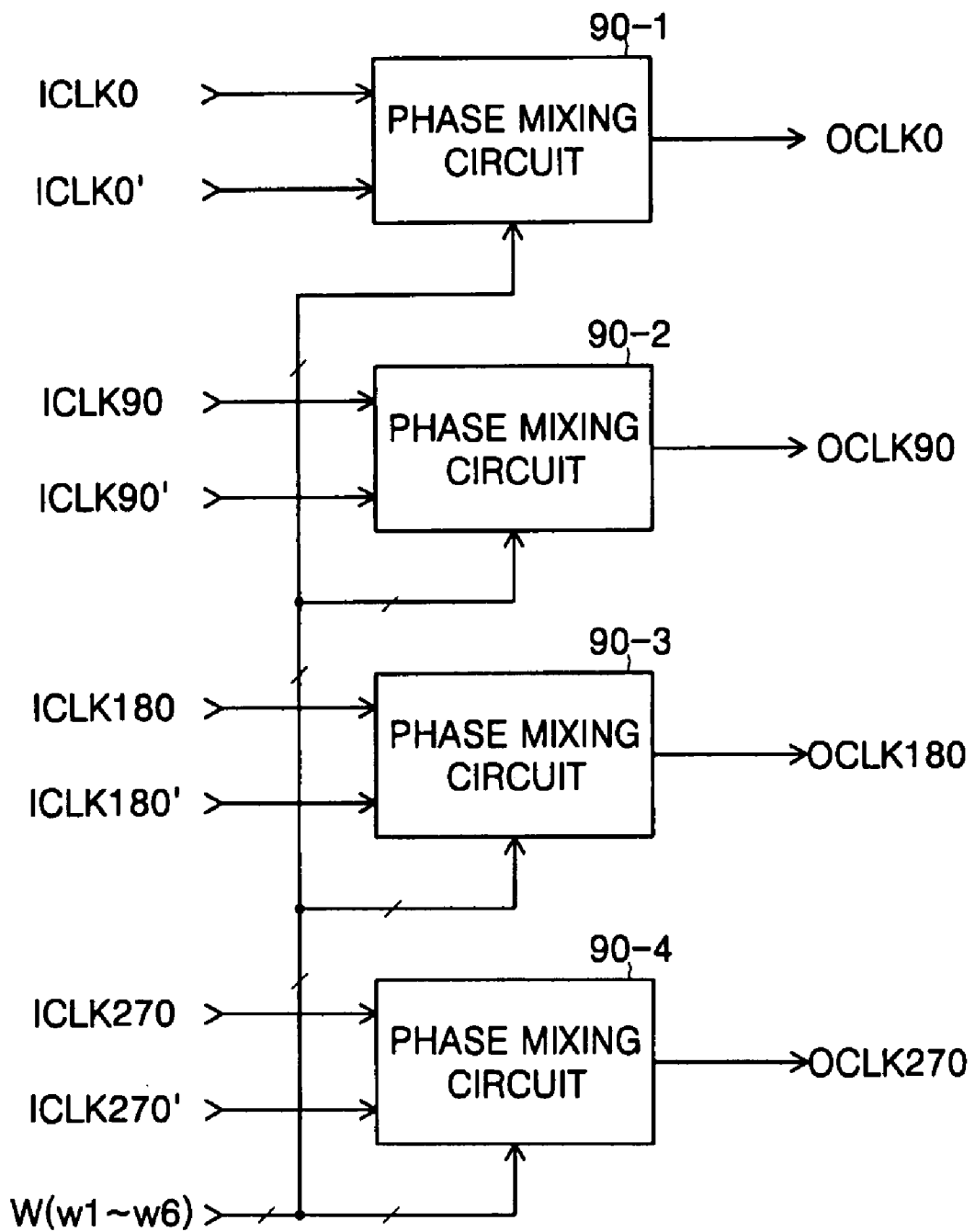
FIG. 9 is a block diagram illustrating a phase mixer of the delay locked loop of FIG. 3.

FIG. 9 is a block diagram illustrating the phase mixer 20 of the delay locked loop of FIG. 3. The phase mixer 20 of FIG. 9 may include phase mixing circuits 90-1 to 90-4.

Functions of the components of FIG. 9 are explained below.

The phase mixing circuit 90-1 may mix the phases of the clock signals ICLK0 and ICLK0' to generate the output clock signal OCLK0 in response to the weight signal W, the phase mixing circuit 90-2 may mix the phases of the clock signals ICLK90 and ICLK90' to generate the output clock signal OCLK90 in response to the weight signal W, the phase mixing circuit 90-3 may mix the phases of the clock signals ICLK180 and ICLK180' to generate the output clock signal OCLK180 in response to the weight signal W, and/or the phase mixing circuit 90-4 may mix the phases of the clock signals ICLK270 and ICLK270' to generate the output clock signal OCLK270 in response to the weight signal W. For example, ICLK0, ICLK90, ICLK180, and/or ICLK270 may be the first clock signal ICLK1, and/or ICLK0', ICLK90' ICLK180' and/or ICLK270' may be the second clock signal ICLK2.

Each of the phase mixing circuits 90-1 to 90-4 may be realized by a typical phase mixing circuit.

Figure 10:
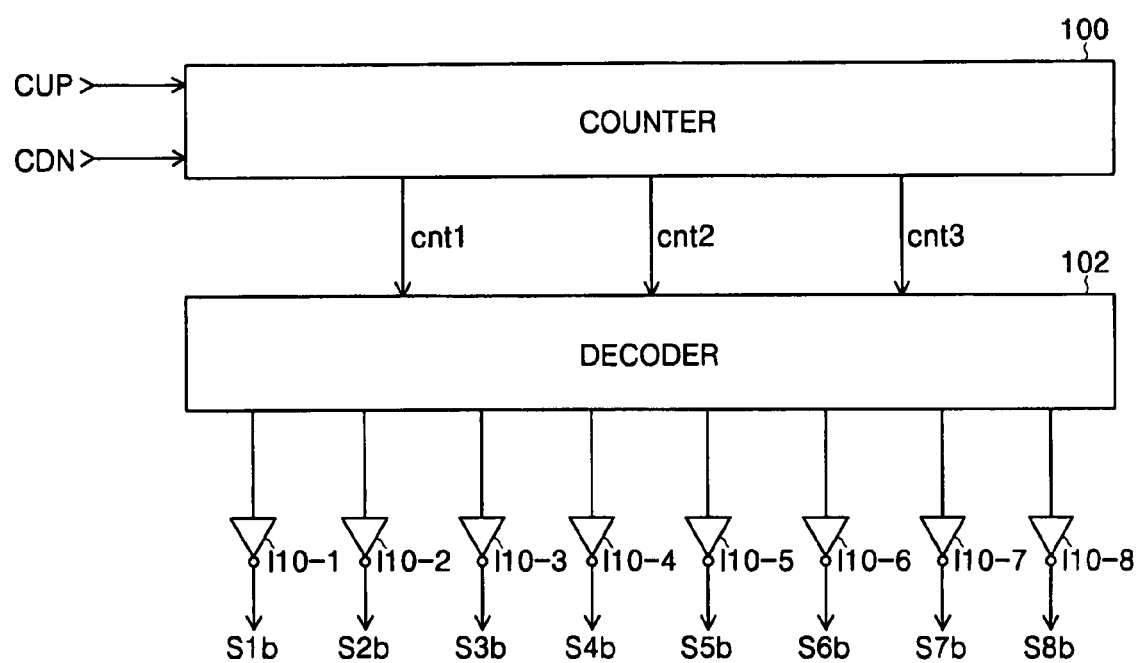
FIG. 10 is a schematic diagram illustrating a selecting signal generator of the delay locked loop of FIG. 3.

FIG. 10 is a schematic diagram illustrating the selecting signal generator 42 of the delay locked loop of FIG. 3. The selecting signal generator 42 of FIG. 10 may include a counter 100, a decoder 102, and/or inverters I10-1 to I10-8.

FIG. 10 shows the selecting signal generator 42 which may generate an 8-bit selecting signal SCON (e.g., s1 to s8).

Functions of the components of FIG. 10 are explained below.

The counter 100 may perform up counting in response to the second up signal CUP and/or down counting in response to the second down signal CDN to generate the 3-bit counting signal cnt1 to cnt3. The decoder 102 may decode the 3-bit counting signal cnt1 to cnt3 to make one among the 8-bit selecting signal SCON (e.g., s1 to s8) become a high level. The inverters I10-1 to I10-8 may invert the 8-bit selecting signal SCON and/or make one signal among the inverted 8-bit selecting signals s1$b$ to s8$b$ become a low level.

For example, the counter 90 may be configured to count the 3-bit counting signal cnt1 to cnt3 from "000" to "111" in response to the second up signal CUP and to count the 3-bit counting signal cnt1 to cnt3 from "111" to "000" in response to the second down signal CDN. The decoder 92 may be realized by a typical decoder similar to the decoder 62 of FIG. 6.

The selecting signal generator 42 of FIG. 10 may be configured to generate the counting signal cnt1 to cnt3 using the second up and down signals CUP and CDN output from the second phase difference detector 24. In another example embodiment, the selecting signal generator 42 may be configured to generate the counting signal cnt1 to cnt3 using the first up and down signals UP and DN output from the first phase difference detector 10.

The selecting signal generator 42 of FIG. 10 of an example embodiment may be configured to generate the counting signal cnt1 to cont3 using the counter 100 (for example, a discrete counter). The selecting signal generator 42 of another example embodiment may be configured to generate the selecting signal by the decoder 102 decoding the output signal of the counter 60 of FIG. 6 or the output signal of the weight signal generator 74 of FIG. 7 without using the counter 100 of FIG. 10.

Figure 11:
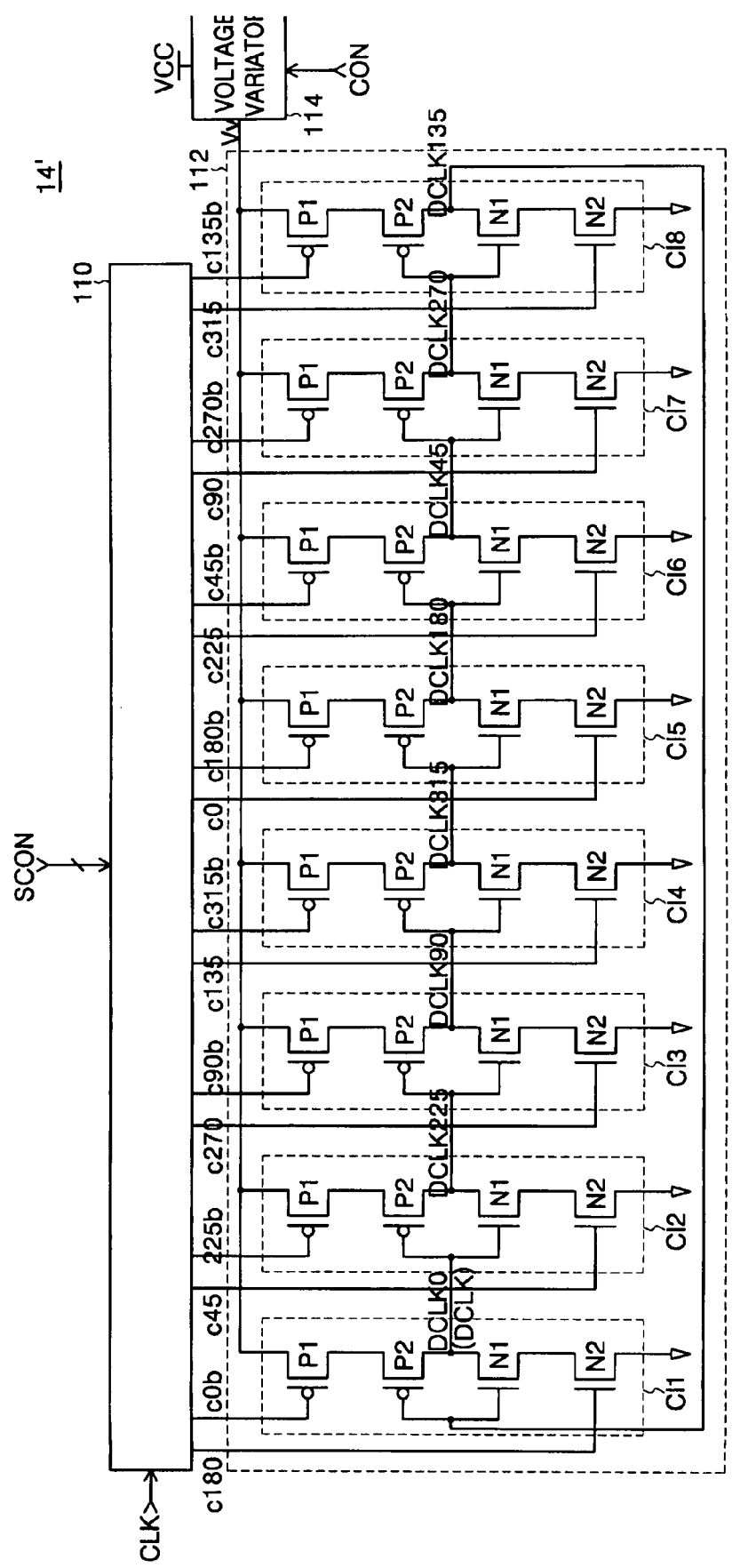
FIG. 11 is a circuit diagram illustrating a delay of the delay locked loop of FIG. 3 according to an example embodiment.

FIG. 11 is a circuit diagram illustrating the delay 14' of the delay locked loop of FIG. 3. The delay 14' of FIG. 11 may include a selector 110, a delay circuit 112, and/or a voltage variator 114. The delay circuit 112 may include inverters CI1 to CI8 which are dependently connected to each other in the form of a ring, and each of the inverters CI1 to CI8 may include two PMOS transistors P1 and P2 and/or two NMOS transistors N1 and N2 which are serially connected to each other.

Functions of the components of FIG. 11 are explained below.

The selector 110 may generate inverted control signals c0$b$ to c315$b$ having a low level and control signals c0 to c315 having a high level if the pulse signal CLK is activated. The selector 110 may make one among the inverted control signals c0$b$ to c315$b$ become a high level and one among the control signals c0 to c315 become a low level in response to the selecting signal SCON (e.g., s1$b$ to s8$b$) if the pulse signal CLK is inactivated. For example, one inverted control signal among the inverted control signals c0$b$ to c315 which transitions to a high level and one control signal among the control signals c0 to c315 which transitions to a low level in response to the selecting signal SCON (e.g., s1$b$ to s8$b$) may be generated. For example, if the inverted control signal, for example, in this case c45$b$, transitions to a high level, the control signal c45 may transition to a low level. The inverters CI1 to CI8 of the delay circuit 112 may adjust the delay time of the 8 delay clock signals DCLK0 to DCLK315 in response to the voltage variator 114, and/or each of the inverters CI1 to CI8 may delay an output signal of an immediately previous inverter before outputting the output signal such that the PMOS transistor P1 and the NMOS transistor N2 of each of the 8 inverters CI1 to CI8 are turned on in response to the inverted control signals c0b to c315b having a low level and the control signals c0 to c315 having a high level if the pulse signal CLK is activated. On the other hand, if the pulse signal CLK is inactivated, the PMOS transistor P1 of one inverter CI6 may be turned off in response to the one inverted control signal c45b which transitions to a high level and the NMOS transistor N2 of another inverter CI1 may be turned off in response to the one control signal c45 which transitions to a low level, so that of the two delay clock signals having a phase difference of 180° (for example, in this case DCLK45 and DCLK225) the rising transition of one delay clock signal DCLK45 and the falling transition of the other clock signal DCLK225 may not occur. For example, of the two delay clock signals having a phase difference of 180° DCLK45 and DCLK225 the falling transition of the one delay clock signal DCLK45 and the rising transition of the other clock signal DCLK225 may be possible, and/or if the falling transition of the one delay clock signal DCLK45 and the rising transition of the other clock signal DCLK225 occur, the remaining 6 delay clock signals (for example, in this case DCLK0, DCLK90, DCLK135, DCLK180, DCLK270, and DCLK 315) may be generated by the delay circuit 112 by respectively delaying the 2 delay clock signals having a phase difference of 180° DCLK45 and DCLK225. The voltage variator 114 may receive the supply voltage VCC and/or vary a supply voltage Vv supplied to the delay circuit 112 in response to the control signal CON.

The inverters CI1 to CI8 of the delay of FIG. 11 may adjust the delay time of the 8 delay clock signals in response to the supply voltage Vv supplied from the voltage variator 114, each of the inverters CI1 to CI8 may be delayed during the delay time in response to the delay clock signal output from the immediately previous inverter if the pulse signal CLK is activated, and the rising transition or falling transition of the 2 delay clock signals having a phase difference of 180° DCLK45 and DCLK225 among the 8 delay clock signals may occur in response to the falling transition or rising transition of the delay clock signal output from the immediately previous inverter so that the rising transition or the falling transition of the other 6 delay clock signals DCLK0, DCLK90, DCLK135, DCLK180, DCLK270, and DCLK 315 may occur. Accordingly, because transition of the 8 delay clock signals may occur regardless of the falling transition of the input clock signal ECLK, even though the timing jitter may occur in the input clock signal ECLK, the 8 delay clock signals may have a more exact duty cycle, for example a duty cycle of exactly 50%, regardless of the variation of the input clock signal ECLK even though the duty cycle may change.

Although example embodiments of FIG. 11 are described above in reference to the inverted control signal c45b and the control signal c45, any one inverted control signal among the inverted control signals c0b to c315b may become a high level and one corresponding control signal among the control signals c0 to c315 may become a low level in response to the selecting signal SCON if the pulse signal CLK is inactivated. Accordingly, for any two of the delay clock signals having a phase difference of 180° the rising transition of the one clock signal and the falling transition of the other clock signal may not occur.

Figure 12:
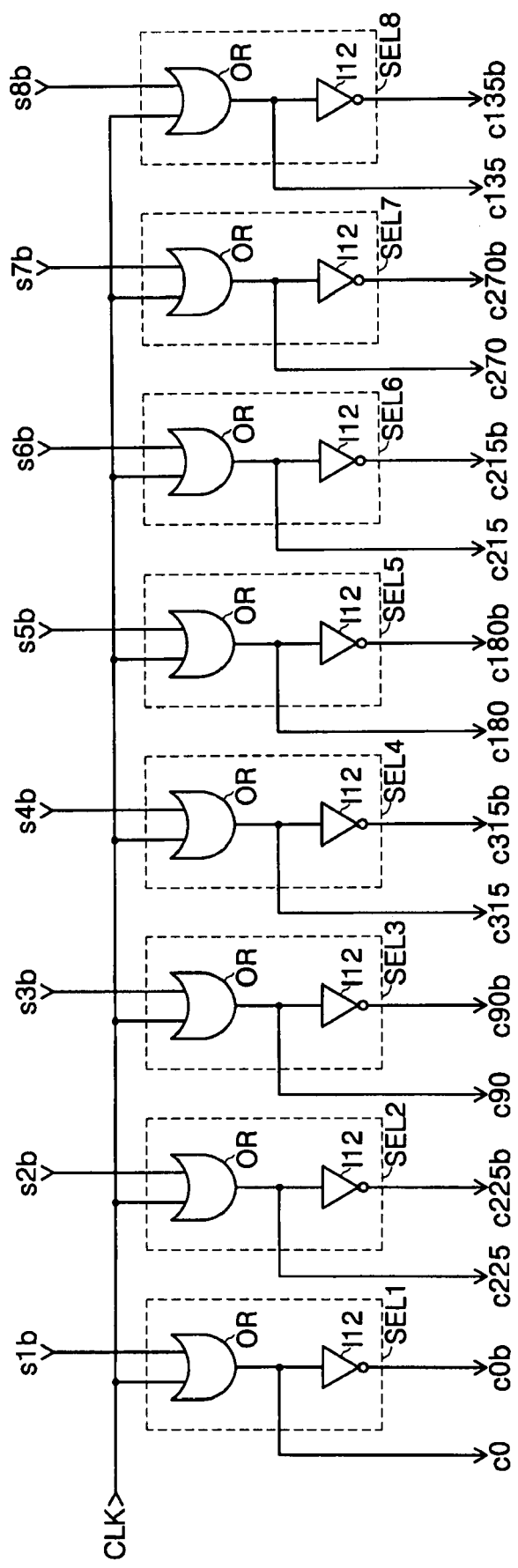
FIG. 12 is a circuit diagram illustrating a selector of the delay of FIG. 11.

FIG. 12 is a circuit diagram illustrating the selector 110 of the delay 14' of FIG. 11. The selector 110 of FIG. 12 may include 8 selecting circuits SEL1 to SEL8. Each of the 8 selecting circuits may include an OR gate OR and/or an inverter 112.

An operation of the selector 110 of FIG. 12 is explained below.

The OR gates OR of the selecting circuits SEL1 to SEL8 may logical-sum the clock signal CLK and the selecting signal SCON (e.g., s1b to s8b) to generate 8 control signals c0 to c315. The inverters I12 of the selecting circuits SEL1 to SEL8 may invert the 8 control signals c0 to c315 to generate 8 inverted control signals c0b to c315b.

If the pulse signal CLK is generated having a high level, the selecting signal s1b has a low level, and the selecting signals s2b to s8b have a high level, the control signals c0 to c315 having a high level and the inverted control signals c0b to c315b having a low level may be generated. If the pulse signal CLK is generated having a low level, the selecting signal s1b has a low level, and the selecting signals s2b to s8b have a high level, the control signal c0 having a low level and the inverted control signal c0b having a high level may be generated, the remaining control signals may maintain a high level, and/or the remaining inverted control signals may maintain a low level. For example, if the pulse signal CLK is generated having a low level, one control signal and inverted control signal selected in response to the selecting signal may transition to a low level and a high level, respectively.

Figure 13:
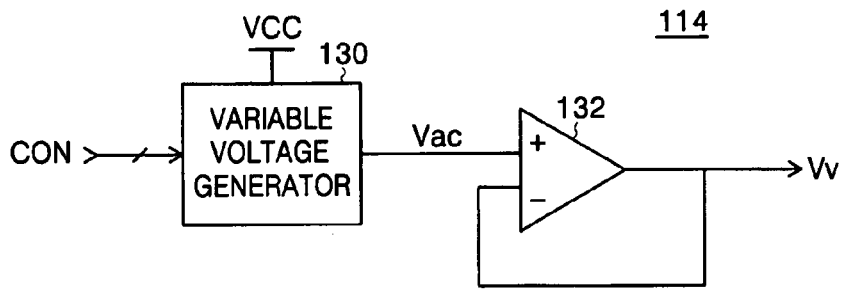
FIG. 13 is a circuit diagram illustrating a voltage variator of the delay of FIG. 11.

FIG. 13 is a circuit diagram illustrating the voltage variator 114 of the delay of FIG. 11. The voltage variator 114 of FIG. 13 may include a variable voltage generator 130 and/or an amplifier 132.

Functions of the components of FIG. 13 are explained below.

The variable voltage generator may receive the power supply voltage VCC. The variable voltage generator 130 may vary a variable voltage Vac in response to the control signal CON. The amplifier 132 may amplify a voltage difference between the variable voltage Vac and the supply voltage Vv to vary a level of the supply voltage Vv.

The delay time of the inverters CI1 to CI8 of the delay 14' of FIG. 11 may depend on the level of the supply voltage Vv supplied from the voltage variator of FIG. 13.

The delay time of the inverters if the level of the supply voltage Vv is higher is shorter than the delay time of the inverters if the level of the supply voltage Vv is lower.

Figure 14:
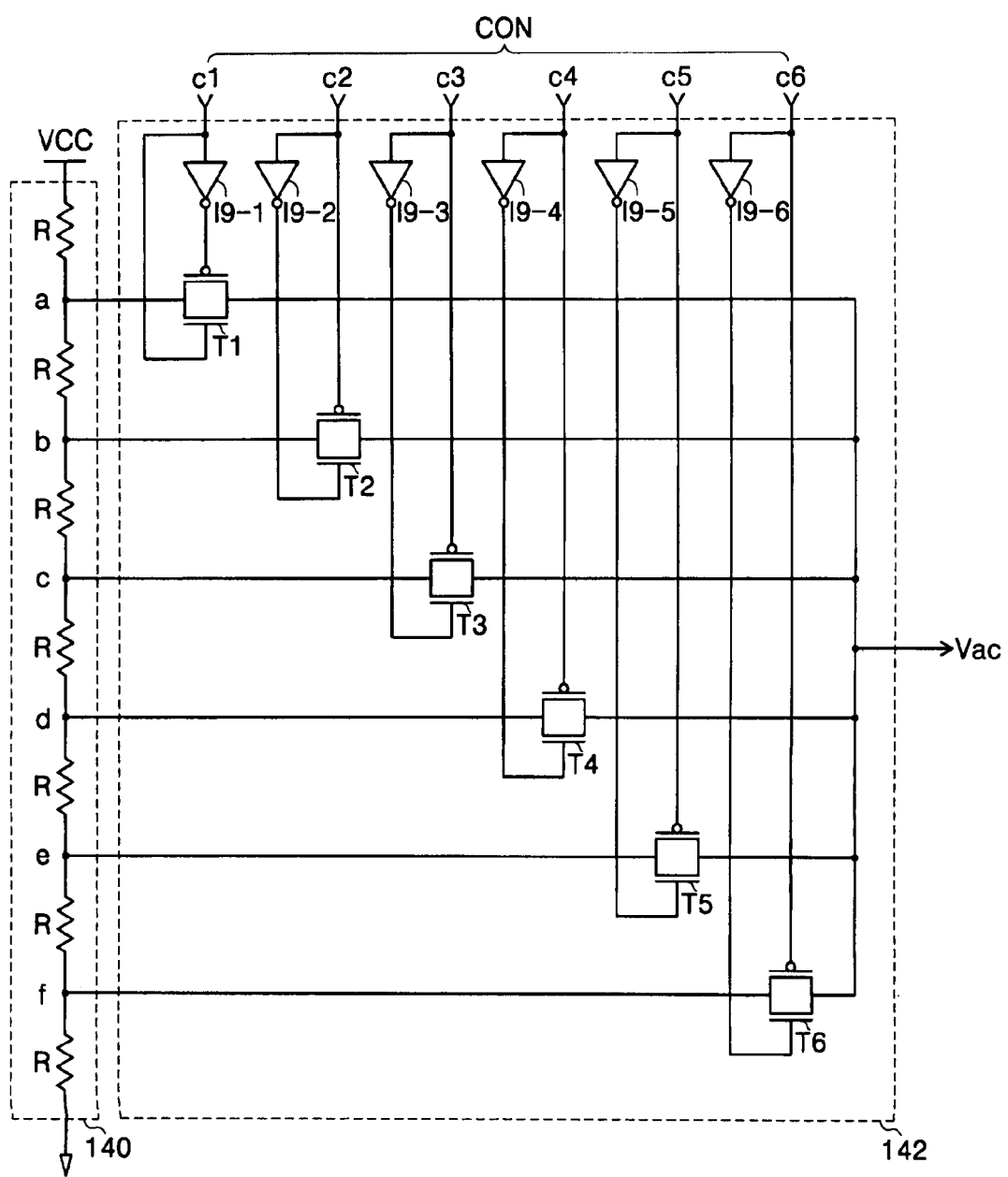
FIG. 14 is a circuit diagram illustrating a variable voltage generator of the voltage variator of FIG. 13.

FIG. 14 is a circuit diagram illustrating the variable voltage generator 130 of the voltage variator of FIG. 13. The variable voltage generator 130 of FIG. 14 may include a voltage divider 140 and/or a switching portion 142. The voltage divider 140 may include resistors R which are serially connected between the power voltage VCC and a ground voltage, and/or the switching portion 142 may include inverters I9-1 to I9-6 and/or CMOS transmission gates T1 to T6.

FIG. 14 shows that the variable voltage generator 130 may receive the control signal CON of 6 bits c1 to c6 output from the control signal generator 12 of FIG. 6.

The voltage divider 140 may divide a voltage using the resistors R and/or generate the divided voltages 6VCC/7, 5VCC/7, 4VCC/7, 3VCC/7, 2VCC/7, and VCC/7 through nodes "a" to "f". For example, the voltage divider 140 may include 7 resistors with nodes "a" to "f" between the resistors. The CMOS transmission gates T1 to T6 may receive the divided voltages from nodes "a" to "f," respectively. One of the CMOS transmission gates T1 to T6 may be turned on in response to the 6-bit signal c1 to c6 so that the switching portion 142 may generate the variable voltage Vac.

For example, if the control signal c1 to c6 is "100000", the CMOS transmission gate T1 may be turned on, so that the divided voltage 6Vcc/7 at the node "a" may be generated as the variable voltage Vac.

Figure 15:
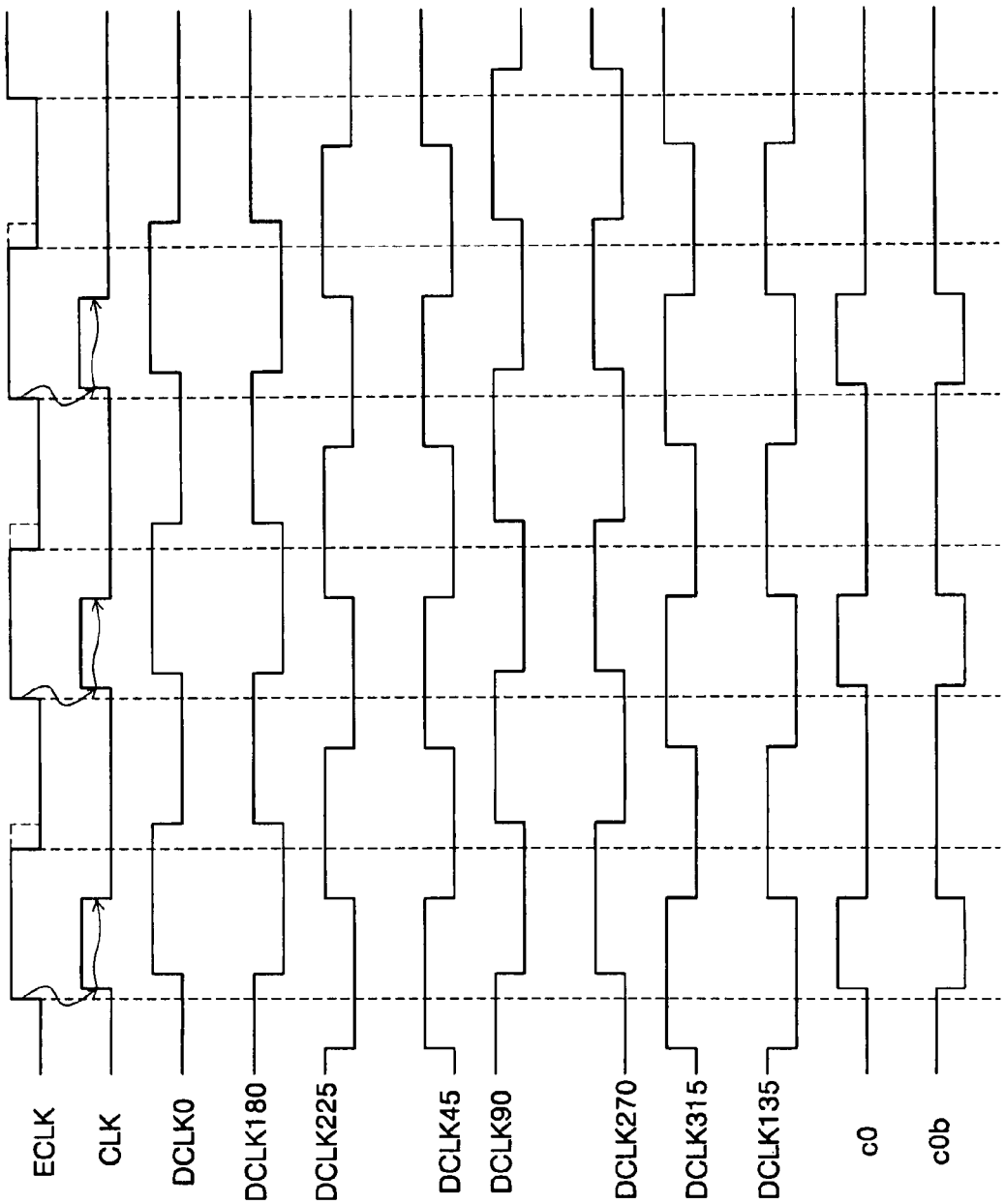
FIG. 15 is an example timing diagram illustrating an operation of the delay of FIG. 11.

FIG. 15 is an example timing diagram illustrating an operation of the delay 14' of FIG. 11 according to an example embodiment where the control signals excluding the control signal c0 have a high level, the inverted control signals excluding the inverted control signal c0b have a low level, and the 8 clock signals having the phase difference of 45° therebetween are generated.

In FIG. 15, if the rising edge of the input clock signal ECLK is detected and the pulse signal CLK is generated, the control signal c0 and/or the inverted control signal c0b, which have a phase difference of 180°, may be generated in response to the pulse signal CLK. For example, the control signal c0 having a high level and the inverted controls signal c0b having a low level may be generated if the pulse signal CLK has a high level. On the other hand, the control signal c0 having a low level and the inverted control signal c0b having a high level may be generated if the pulse signal CLK has a low level. If the control signal c0 having a high level and the inverted control signal c0b having a low level are generated, all of the inverters CI1 to CI8 may be enabled, so that each of the inverters CI1 to CI8 may invert the output signal of the immediately previous inverter before outputting it. As shown in FIG. 15, in response to the pulse signal CLK having a high level, the inverters CI1 and CI5 may generate the delay clock signal DCLK0 which performs the rising transition and the delay clock signal DCLK180 which performs the falling transition, respectively, and transition of the other delay clock signals DCLK225, DCLK90, DCLK315, DCLK 45, DCLK270, and DCLK135 may occur in response to transition of the delay clock signals DCLK0 and DCLK180. On the other hand, if the pulse signal CLK has a low level, the control signal c0 having a low level and the inverted control signal c0b having a high level may be generated, the PMOS transistor P1 of the inverter CI1 may be turned off, and/or the NMOS transistor N2 of the inverter CI5 may be turned off, so that the rising transition of the delay clock signal DCLK0 and the falling transition of the delay clock signal DCLK180 may be prevented, and/or the inverters CI1 and CI5 may generate the delay clock signal DCLK0 which performs the falling transition and the delay clock signal DCLK180 which performs the rising transition, respectively. The transition of the other delay clock signals DCLK225, DCLK90, DCLK315, DCLK 45, DCLK270, and DCLK135 may occur in response to transition of the delay clock signals DCLK0 and DCLK180.

Accordingly, the 8 delay clock signals CLK0 to CLK315 may have an exact duty cycle, for example a duty cycle of exactly 50%, even though the duty cycle of the input clock signal ECLK and/or the falling edge of the input clock signal may change as indicated by dotted lines in FIG. 15.

The delay 14' of the delay locked loop according to an example embodiment may perform transition of at least one delay clock signal in response to the pulse signal CLK generated in response to the rising or falling transition of the input clock signal ECLK, and/or may automatically performs transition of the remaining delay clock signals in response to transition of the at least one delay clock signal because the inverters may be connected in the form of a ring.

Figure 16:
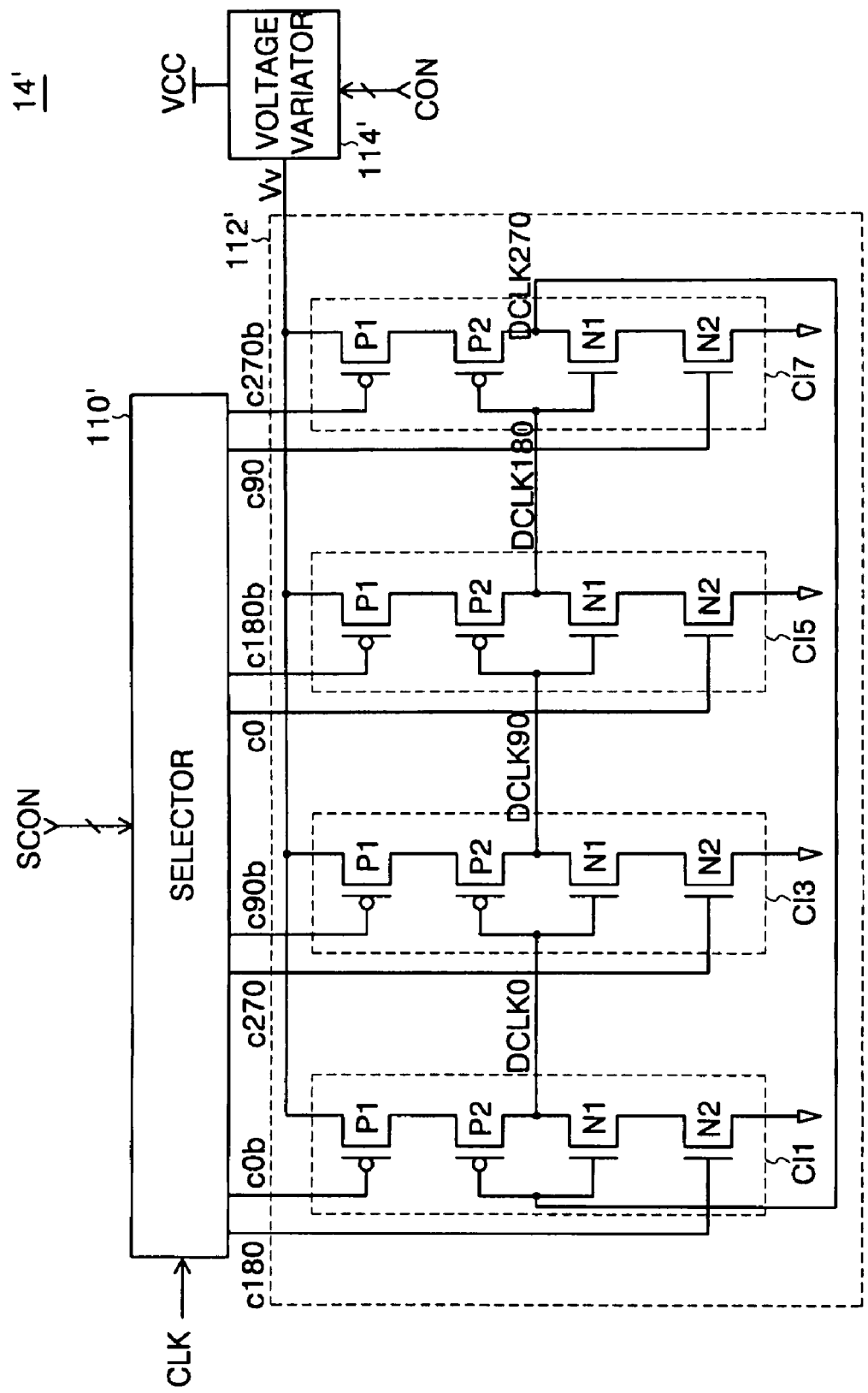
FIG. 16 is a circuit diagram illustrating a delay of the delay locked loop of FIG. 3 according to another example embodiment.

FIG. 16 is a circuit diagram illustrating a delay 14' of the delay locked loop of FIG. 3 according to another example embodiment. The delay 14' of FIG. 16 may be configured by replacing the selector 110, the delay circuit 112 and/or the voltage variator 114 of FIG. 11 with a selector 110', a delay circuit 112' and/or a voltage variator 114'. The delay circuit 112' may be configured such that the even-number inverters CI2, CI4, CI6, and CI8 of the delay circuit 112 of FIG. 11 are removed and/or the odd-number inverters CI1, CI3, CI5, and CI7 are connected in the form of a ring.

Functions of the components of FIG. 16 are explained below.

The selector 110' may generate the inverted control signals c0b to c270b having a low level and/or control signals c0 to c270 having a high level if the pulse signal CLK is activated, make one among the inverted control signals c0b to c270b become a high level and one among the control signals c0 to c270 become a low level in response to the selecting signal SCON (e.g., s1b, s3b, s5b, and s7b) if the pulse signal CLK is inactivated. The one inverted control signal which transitions to a high level and the one control signal which transitions to a low level in response to the selecting signal SCON (i.e., s1b, s3b, s5b, and s7b) may be generated. For example, if the inverted control signal c0b transitions to a high level, the control signal c0 may transition to a low level. The inverters CI1 to CI7 of the delay circuit 112' may adjust the delay time of the 4 delay clock signals DCLK0 to DCLK270 by the voltage variator 114' and/or delay the output signal of the immediately previous inverter before outputting it such that the PMOS transistor P1 and the NMOS transistor N2 of each of the 4 inverters CI1 to CI7 are turned on in response to the inverted control signals c0b to c270b having a low level and the control signals c0 to c270 having a high level if the pulse signal CLK is activated. On the other hand, if the pulse signal CLK is inactivated, in response to the selecting signal SCON (e.g., s1b, s3b, s5b, and s7b), the PMOS transistor P1 of one inverter CI1 may be turned off in response to the one inverted control signal c0b which transitions to a high level and the NMOS transistor N2 of the other inverter CI5 may be turned off in response to one control signal c0 which transitions to a low level, so that of the two delay clock signals having a phase difference of 180° DCLK0 and DCLK180 the rising transition of the one delay clock signal DCLK0 and the falling transition of the other clock signal DCLK180 may not occur. For example, of the two delay clock signals having a phase difference of 180° DCLK0 and DCLK180 the falling transition of the one delay clock signal DCLK0 and the rising transition of the other clock signal DCLK180 may be possible, and if the falling transition of the one delay clock signal DCLK0 and the rising transition of the other clock signal DCLK180 occur, the remaining 2 delay clock signals which have different phases but the same phase difference (for example, in this case DCLK90 and DCLK270) may be generated by the delay circuit 112' by respectively delaying the 2 delay clock signals DCLK0 and DCLK180. The voltage variator 114' may vary a supply voltage Vv supplied to the delay circuit 112' in response to the control signal CON.

Although not described above, the selector 110' and the voltage variator 114' may be configured similar to the selector 110 and the voltage variator 114 described above.

As shown in FIGS. 11 and 16, the delay circuit 112 or 112' of the delay 14' according to another example embodiment may be configured by connecting an even-number of inverters in the form of a ring. For example, any even-number of inverters dependently connected in the form of a ring may comprise the delay circuit 112 of the delay 14'. The rising transition or falling transition of the delay clock signal generated from one among the even number of inverters may occur in response to the rising transition or falling transition of the input clock signal ECLK, and/or the rising transition or falling transition of the other delay clock signals may occur in response to the rising transition or falling transition of the delay clock signal generated from the one inverter among the even number of inverters. The falling transition or rising transition of the delay clock signal generated from one among the even number of inverters may occur in response to the falling transition or rising transition of the input clock signal ECLK, and/or the rising transition or falling transition of the other delay clock signals may occur in response to the falling transition or rising transition of the delay clock signal generated from one among the even number of inverters.

Accordingly, because transition of the delay clock signals may occur regardless of the falling transition or rising transition of the input clock signal ECLK, the timing jitter may occur in the input clock signal ECLK, and even though the duty cycle of the input clock signal ECLK may change, the delay clock signals DCLK1 to DCLKn (DCLK) may be stably and exactly generated.

The delays described above may be configured so that their delay time may be adjusted by varying the voltage supplied to the inverters, but the delays described above may be configured so that the capacitance of the respective output lines of the inverters can vary.

Even though not shown, the delay locked loop according to example embodiments may include a first divider which divides the input clock signal ECLK and/or applies the divided input clock signal to the first and second phase difference detectors 10 and 24 and/or a second divider which divides the delay and feedback clock signals DCLK and FCLK and/or applies the divided delay and feedback clock signals DCLK and FCLK to the first and second phase difference detectors 10 and 24.

In an above described example embodiment, a configuration of a digital delay locked loop is shown as the delay locked loop, but the delay of example embodiments may be applied to an analog delay locked loop.

Figure 17:
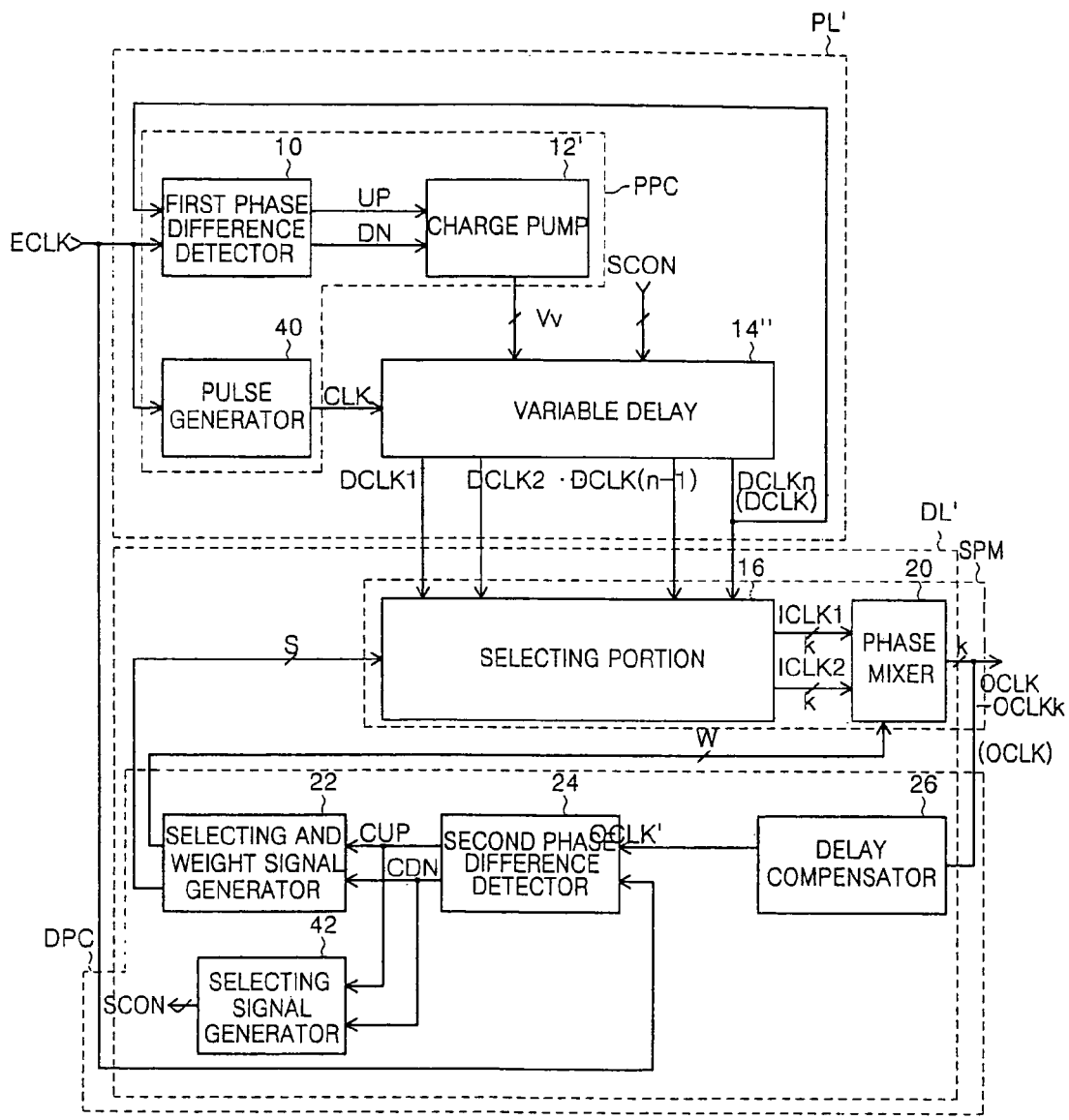
FIG. 17 is a block diagram illustrating a delay locked loop according to another example embodiment.

FIG. 17 is a block diagram illustrating a delay locked loop according to another example embodiment. The delay locked loop of FIG. 17 may be configured such that the control signal generator 12 and the delay 14' of FIG. 4 are replaced with a charge pump 12' and a variable delay 14" For example the period portion controller PPC may include the first phase difference detector 10, the pulse generator 40, and/or the charge pump 12'.

Functions of the components in FIG. 17 may be similar to corresponding components in FIG. 3. Accordingly, while functions of the components of FIG. 17 are explained below, particular attention is paid to those components which are unique to FIG. 17 if compared to FIG. 3b. Namely, the functions of the charge pump 12' and the variable delay 14" are described below.

The charge pump 12' may raise the level of the supply voltage Vv in response to the up signal UP and/or drop the level of the supply voltage Vv in response to the down signal DN. The variable delay 14" may operate such that the delay time varies in response to the supply voltage Vv, the rising transition or falling transition of at least one among the n delay clock signals DCLK1 to DCLKn which is selected in response to the selecting signal SCON may occur if the pulse signal CLK is activated, the falling transition or rising transition of the at least one selected delay clock signal may not occur if the pulse signal CLK is inactivated, and/or the rising transition or the falling transition of the remaining non-selected delay clock signals may occur in response to transition of the at least one selected delay clock signal.

Figure 18:
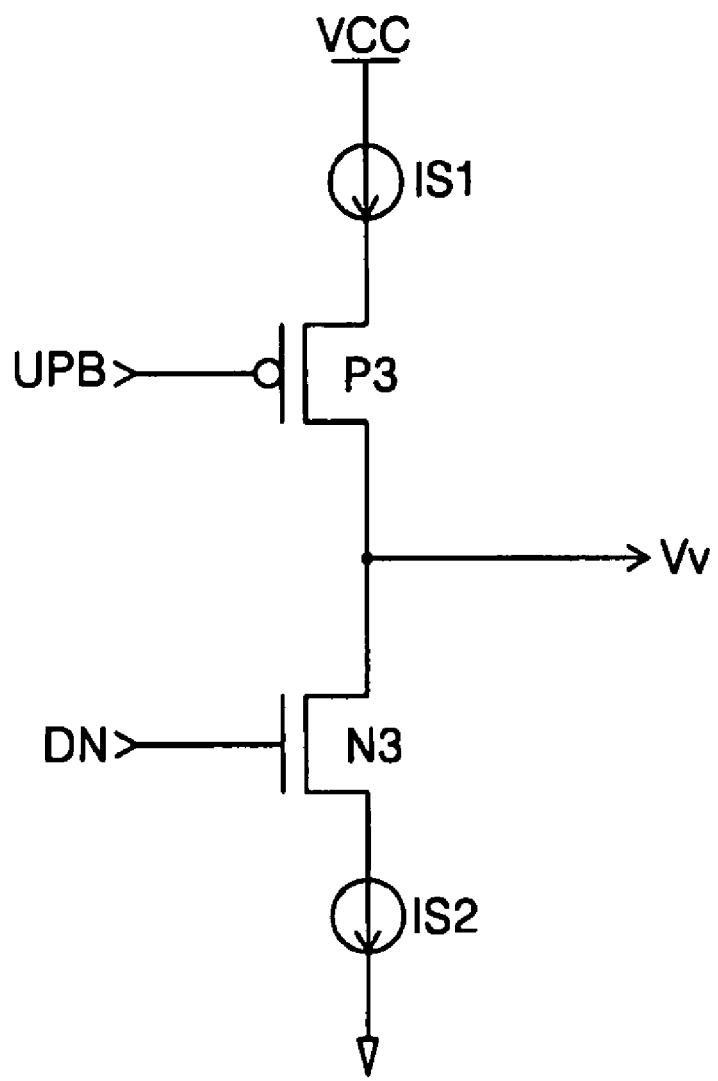
FIG. 18 is a circuit diagram illustrating a charge pump of the delay locked loop of FIG. 17 according to another example embodiment.

FIG. 18 is a circuit diagram illustrating the charge pump 12' of the delay locked loop of FIG. 17. The charge pump 12' of FIG. 18 may include supply and discharge constant current sources IS1 and IS2, a PMOS transistor P3, and/or an NMOS transistor N3. The charge pump 12' may receive the supply voltage VCC. The supply constant current source IS1 the PMOS transistor P3, the NMOS transistor N3, and/or the discharge constant current IS2 may be connected in series between the supply voltage VCC and the ground voltage.

An operation of the charge pump of FIG. 18 is described below.

If an inverted up signal UPB having a low level is applied, the PMOS transistor P3 may be turned on and/or the electric current of the supply constant current source IS1 may be supplied to an output terminal via the PMOS transistor P3 to raise the level of the supply voltage Vv. On the other hand, if the down signal DN having a high level is applied, the NMOS transistor N3 may be turned on, and the electric current from the output terminal may be discharged via the NMOS transistor N3 and flow to the discharge constant current source IS2 to drop the level of the supply voltage Vv. If the inverted up signal UPB having a low level and the down signal DN having a high level are applied in a locked state, both the PMOS transistor P3 and the NMOS transistor N3 may be turned on, so that the electric current flowing to the output terminal from the supply constant current source IS1 may become the same in amount as the electric current discharged to the discharge constant current source IS2 from the output terminal, thereby maintaining the level of the supply voltage Vv in its current state.

Figure 19:
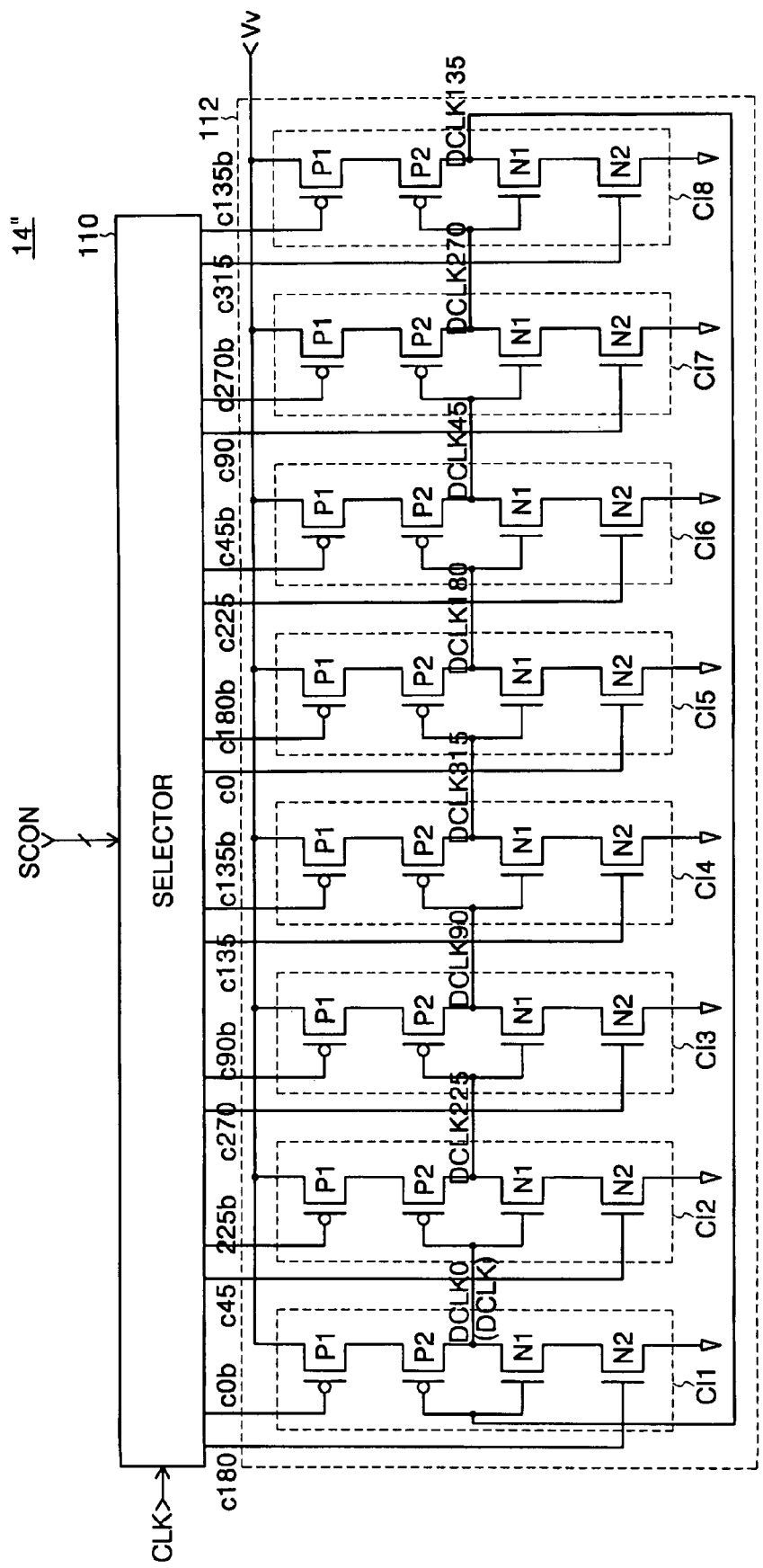
FIG. 19 is a circuit diagram illustrating a variable delay of the delay locked loop of FIG. 17 according to another example embodiment.

FIG. 19 is a circuit diagram illustrating the variable delay 14" of the delay locked loop of FIG. 17. The variable delay of FIG. 19 may be configured such that the voltage variator 114 of the variable delay of FIG. 11 is removed.

Functions of the components of FIG. 19 will be easily understood with reference to the description on FIG. 11, and description thereof will thus be omitted.

FIG. 17 shows an analog delay locked loop according to an example embodiment, and the delay of the delay locked loop of example embodiments may be applied to both the digital delay locked loop of example embodiments and the analog delay locked loop of example embodiments.

Figure 20:
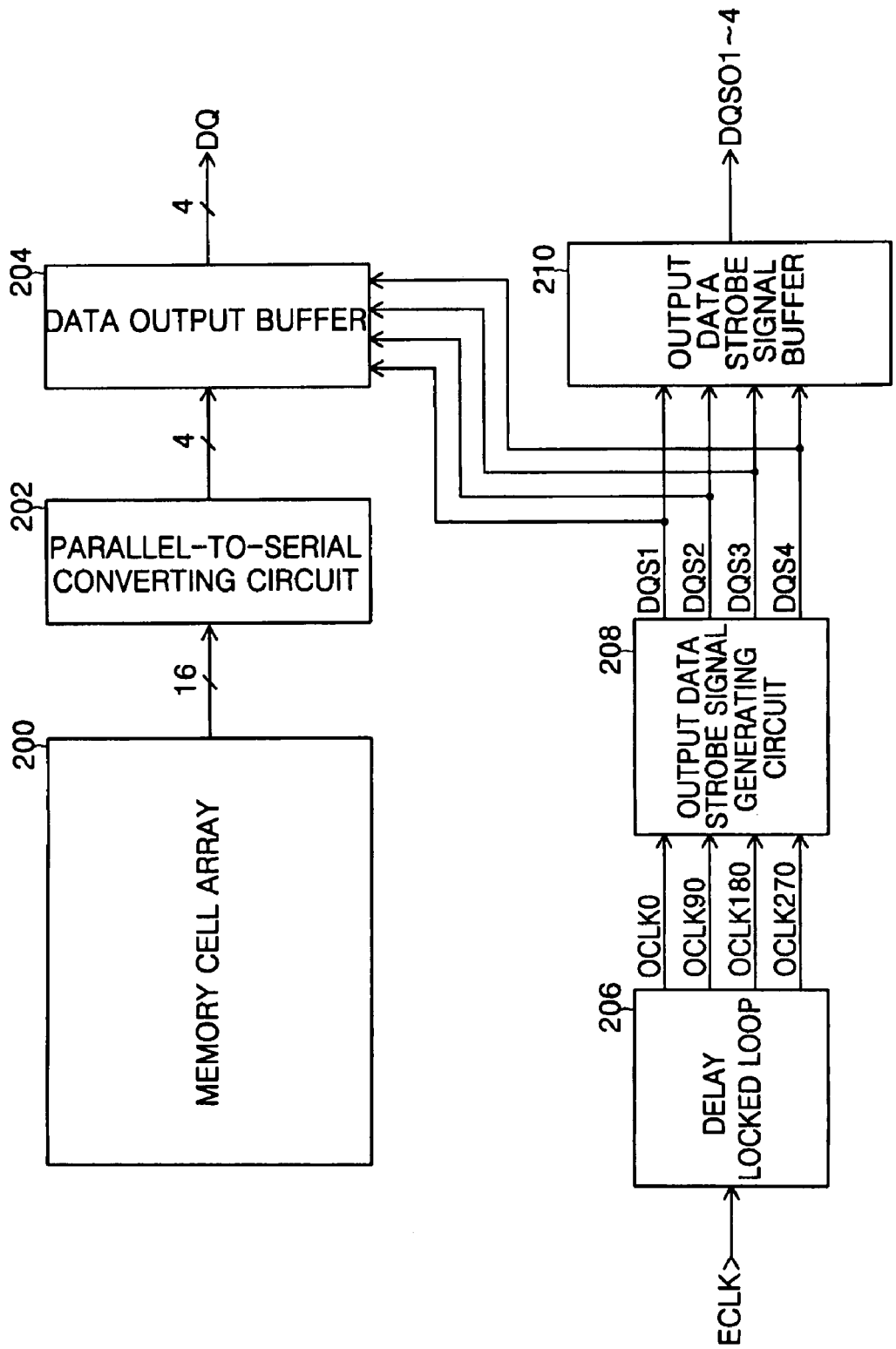
FIG. 20 is a block diagram illustrating a semiconductor memory device including the delay locked loop according to an example embodiment.

FIG. 20 is a block diagram illustrating a semiconductor memory device including the delay locked loop according to an example embodiment. The semiconductor memory device of FIG. 20 may include a memory cell array 200, a parallel-to-serial converting circuit 202, a data output buffer 204, a delay locked loop 206, an output data strobe signal generating circuit 208, and/or an output data strobe signal buffer 210.

In the semiconductor memory device of FIG. 20, a burst length may be 4 and/or 4-bit output data DQ1 to DQ4 may be generated by the data output buffer 204 in response to 4 output data strobe signals DQS1 to DQS4 output from the output data strobe signal generating circuit 208.

Functions of the components of FIG. 20 are explained below.

The memory cell array 200 may output 16-bit data in a read operation. The parallel-to-serial converting circuit 202 may convert the 16-bit parallel data into 4-bit serial data and/or output the 4-bit serial data. The data output buffer 204 may sequentially output 4-bit serial data as output data DQ1 to DQ4 in response to the data strobe signals DQS1 to DQS4. The delay locked loop 206 may receive the input clock signal ECLK applied from an external portion to generate 4 output clock signals OCLK0, OCLK90, OCLK180, and OCLK270 (OCLK). The output data strobe signal generating circuit 208 may combine the 4 output clock signals OCLK0, OCLK90, OCLK180, and OCLK270 two by two to generate 4 data strobe signals DQS1 to DQS4. For example, the output clock signals OCLK0 and OCLK270 may be ANDed to generate the data strobe signal DQS1, the output clock signals OCLK0 and OCLK90 may be ANDed to generate the data strobe signal DQS2, the output clock signals OCLK90 and OCLK180 may be ANDed to generate the data strobe signal DQS3, and/or the output clock signals OCLK180 and OCLK270 may be ANDed to generate the data strobe signal DQS4. The output data strobe signal buffer 210 may buffer the 4 output data strobe signals DQS1 to DQS4 to generate buffered output data strobe signals DQSO1 to DQSO4.

For example, the delay locked loop may be employed in the semiconductor memory device as shown in FIG. 20, and even though the input clock signal ECLK may vary, the delay locked loop may generate the 4 output clock signals OCLK0 to OCLK270, which have the phase difference of exactly 90°, and/or combine 4 output clock signals to generate the 4 stable output data strobe signals DQS1 to DQS4.

As described above, the delay locked loop of example embodiments may generate a plurality of clock signals having a more exact duty cycle, for example a duty cycle of exactly 50%, even though the input clock signal may vary.

The semiconductor memory device having the delay locked loop of example embodiments may have improved reliability because a plurality of clock signals are more exactly generated.

Although example embodiments have been shown and described in this specification and figures, it would be appreciated by those skilled in the art that changes may be made to the illustrated and/or described example embodiments without departing from their principles and spirit.

What is claimed is:

1. A delay locked loop, comprising:
a period locked loop portion including a delay, the delay including an even number of delay cells dependently connected in the form of a ring configured to generate an even number of delay clock signals, wherein
transition of at least one delay clock signal of the even number of delay clock signals is configured to be controlled in response to an activated one first selecting signal of an even number of first selecting signals,
transition of the remaining clock signals is configured to occur in response to the at least one delay clock signal,
the period locked loop portion further includes,
a period portion controller configured to compare a phase of an input clock signal and a phase of one delay clock signal of the even number of delay clock signals to generate period portion up and down signals, configured to detect at least one of a rising edge and a falling edge of the input clock signal to generate a pulse signal, and configured to vary a first control signal in response to the period portion up and down signals, and
the period portion controller includes,
a period portion phase difference detector configured to compare the phase of the input clock signal and the phase of the one delay clock signal, configured to generate the period portion up signal if the phase of the input clock signal is in advance of the phase of the one delay clock signal, and configured to generate the period portion down signal if the phase of the one delay clock signal is in advance of the phase of the input clock signal,
a first control signal generator configured to increase the first control signal in response to the period portion up signal and configured to decrease the first control signal in response to the period portion down signal, and
a pulse generator configured to detect at least one of the rising edge or the falling edge of the input clock signal to generate the pulse signal.

2. The delay locked loop of claim 1, wherein
a delay time of the even number of delay cells is varied to generate the even number of delay clock signals in response to the first control signal, the even number of delay clock signals having a same period as a period of the input clock signal.

3. The delay locked loop of claim 2, wherein the delay further includes,
a voltage variator configured to vary a level of a supply voltage in response to the first control signal;
a first selector configured to select one second control signal of an even number of second control signals and one inverted second control signal among a even number of inverted second control signals in response to the even number of first selecting signals and the pulse signal; and
a delay circuit including the even number of delay cells, each of the delay cells including an inverter, each inverter including first and second pull-up transistors and first and second pull-down transistors connected between a supply voltage and a ground voltage, and wherein the even number of inverted second control signals are applied to gates of the first pull-up transistors and the even number of second control signals are applied to gates of the pull-down transistors.

4. The delay locked loop of claim 3, wherein the voltage variator includes,
a voltage divider including a plurality of resistors serially connected between a power supply voltage and the ground voltage configured to generate a plurality of divided voltages;
a second selector configured to select and output one divided voltage of the plurality of divided voltages in response to the first control signal; and
an amplifier configured to generate the supply voltage by amplifying a difference between the one divided voltage output from the second selector and the supply voltage.

5. The delay locked loop of claim 1, further comprising:
a delay locked loop portion including,
a delay portion controller configured to delay one output clock signal of an even number of output clock signals in a compensation delay time to generate a delayed output clock signal, configured to compare a phase of the input clock signal and a phase of the delayed output clock signal to generate delay portion up and down signals, configured to vary a selecting and weight control signal in response to the delay portion up and down signals, and configured to generate the even number of first selecting signals;
a selecting and phase mixing portion configured to generate corresponding delay clock signals two by two from the even number of delay clock signals in response to the selecting and weight control signal and configured to mix phases of the selected two delay clock signals to generate the even number of output clock signals.

6. The delay locked loop of claim 5, wherein the delay portion controller includes,
a delay compensator configured to delay the one output clock signal of the even number of output clock signals in the compensation delay time to generate the delayed output clock signal;
a delay portion phase difference detector configured to compare the phase of the input clock signal and the phase of the delayed output clock signal, configured to generate the delay portion up signal if the phase of the input clock signal is in advance of the phase of the delayed output clock signal, and configured to generate the delay portion down signal if the phase of the delayed output clock signal is in advance of the phase of the input clock signal;

a selecting and weight signal generator configured to increase the selecting and weight control signal in response to the delay portion up signal, configured to reduce the selecting and weight control signal in response to the delay portion down signal, configured to generate a number of bits of the selecting and weight control signal as a weight signal, and configured to generate the remaining bits of the selecting and weight control signal as a second selecting signal; and a selecting signal generator configured to activate the one first selecting signal of the even number of first selecting signals in response to the delay portion up and down signals.

7. The delay locked loop of claim 6, wherein the selecting and phase mixing portion includes, a selecting portion configured to select corresponding delay clock signals two by two from the even number of delay clock signals and configured to output the two corresponding delay clock signals in response to the second selecting signal; and a phase mixer configured to mix the phases of the two corresponding delay clock signals output from the first selector to generate the even number of output clock signals in response to the weight signal.

8. The delay locked loop of claim 1, wherein a delay time of the even number of delay cells is varied to generate the even number of delay clock signals in response to the supply voltage, the even number of delay clock signals having a same period as a period of the input clock signal.

9. The delay locked loop of claim 8, wherein the period portion controller includes, a charge pump configured to increase the level of the supply voltage in response to the period portion up signal and configured to decrease the level of the supply voltage in response to the period portion down signal; and a pulse generator configured to detect at least one of the rising edge or the falling edge of the input clock signal to generate the pulse signal.

10. The delay locked loop of claim 9, wherein the delay further includes, a first selector configured to select one control signal of an even number of control signals and one inverted control signal of an even number of inverted control signals in response to the even number of first selecting signals and the pulse signal; and a delay circuit including the even number of delay cells, each of the delay cells including an inverter, each inverter including first and second pull-up transistors and first and second pull-down transistors connected between the supply voltage and a ground voltage, wherein the even number of inverted control signals are applied to gates of the first pull-up transistors and the even number of control signals are applied to gates of the pull-down transistors.

11. A semiconductor memory device, comprising:

a memory cell array configured to store parallel data in a write operation and configured to output the parallel data in a read operation;

a parallel-to-serial converter configured to convert the parallel data to generate serial data in the read operation;

a data output buffer configured to buffer the serial data in response to each of a plurality of output data strobe signals and configured to output the buffered serial data to an external portion;

the delay locked loop of claim 1, the delay locked loop configured to receive an external clock signal to generate an even number of output clock signals based on the even number of delay clock signals; and an output data strobe signal generator configured to combine the even number of output clock signals to generate the plurality of data strobe signals, wherein transition of at least one delay clock signal of the even number of delay clock signals is configured to be controlled in response to an activated one first selecting signal of an even number of first selecting signals, and transition of the remaining clock signals is configured to occur in response to the at least one delay clock signal.

12. The semiconductor memory device of claim 11, wherein the period locked loop portion includes, a period portion controller configured to compare a phase of the external clock signal and a phase of one delay clock signal of the even number of delay clock signals to generate period portion up and down signals, configured to detect at least one of a rising edge and a falling edge of the external clock signal to generate a pulse signal, and configured to vary a first control signal in response to period portion up and down signals, and wherein a delay time of the even number of delay cells is varied to generate an even number of delay clock signals having a same period as a period of the external clock signal in response to the first control signal.

13. The semiconductor memory device of claim 12, wherein the wherein the period portion controller includes, a period portion phase difference detector configured to compare the phase of the external clock signal and the phase of the one delay clock signal, configured to generate the period portion up signal if the phase of the external clock signal is in advance of the phase of the one delay clock signal, and configured to generate the period portion down signal if the phase of the one delay clock signal is in advance of the phase of the external clock signal;

a first control signal generator configured to increase the first control signal in response to the period portion up signal and configured to reduce the first control signal in response to the period portion down signal; and a pulse generator configured to detect at least one of the rising edge or the falling edge of the input clock signal to generate the pulse signal.

14. The semiconductor memory device of claim 12, wherein the delay includes, a voltage variator configured to vary a level of a supply voltage in response to the first control signal;

a first selector configured to select one second control signal of an even number of second control signals and one inverted second control signal among a even number of inverted second control signals in response to the even number of first selecting signals and the pulse signal; and a delay circuit including the even number of delay cells, each of the delay cells including an inverter each inverter including first and second pull-up transistors and first and second pull-down transistors connected between a supply voltage and a ground voltage, and wherein the even number of inverted second control signals are applied to gates of the first pull-up transistors and the even number of second control signals are applied to gates of the pull-down transistors.

15. The semiconductor memory device of claim 14, wherein the voltage variator includes,
   a voltage divider including a plurality of resistors serially connected between a power supply voltage and the ground voltage configured to generate a plurality of divided voltages;
   a second selector configured to select and output one divided voltage of the plurality of divided voltages in response to the first control signal; and
   an amplifier configured to generate the supply voltage by amplifying a difference between the one divided voltage output from the second selector and the supply voltage.

16. The semiconductor memory device of claim 11, wherein the delay locked loop further includes,
   a delay locked loop portion including,
   a delay portion controller configured to delay one output clock signal of an even number of output clock signals in a compensation delay time to generate a delayed output clock signal, configured to compare a phase of the external clock signal and a phase of the delayed output clock signal to generate delay portion up and down signals, configured to vary a selecting and weight control signal in response to the delay portion up and down signals, and configured to generate the even number of first selecting signals,
   a selecting and phase mixing portion configured to generate corresponding delay clock signals two by two from the even number of delay clock signals in response to the selecting and weight control signal and configured to mix phases of the selected two delay clock signals to generate the even number of output clock signals.

17. The semiconductor memory device of claim 16, wherein the compensation delay time is a delay time of the data output buffer.

18. The semiconductor memory device of claim 16, wherein the delay portion controller includes,
   a delay compensator configured to delay the one output clock signal of the even number of output clock signals in the compensation delay time to generate the delayed output clock signal;
   a delay portion phase difference detector configured to compare the phase of the external clock signal and the phase of the delayed output clock signal, configured to generate the delay portion up signal if the phase of the external clock signal is in advance of the phase of the delayed output clock signal, and configured to generate the delay portion down signal if the phase of the delayed output clock signal is in advance of the phase of the external clock signal;
   a selecting and weight signal generator configured to increase the selecting and weight control signal in response to the delay portion up signal, configured to reduce the selecting and weight control signal in response to the delay portion down signal, configured to generate a number of bits of the selecting and weight control signal as a weight signal, and configured to generate the remaining bits of the selecting and weight control signal as a second selecting signal; and a selecting signal generator configured to activate the one first selecting signal of the even number of first selecting signals in response to the delay portion up and down signals.

19. The semiconductor memory device of claim 18, wherein the selecting and phase mixing portion includes,
   a selecting portion configured to select corresponding delay clock signals two by two from the even number of delay clock signals and configured to output the two corresponding delay clock signals in response to the second selecting signal; and
   a phase mixer configured to mix the phases of the two corresponding delay clock signals output from the first selector to generate the even number of output clock signals.

20. The semiconductor memory device of claim 11, wherein the period locked loop portion further includes,
   a period portion controller configured to compare a phase of the external clock signal and a phase of one delay clock signal of an even number of delay clock signals to generate period portion up and down signals, configured to detect at least one of a rising edge and a falling edge of the external clock signal to generate a pulse signal, and configured to vary a level of a supply voltage in response to the period portion up and down signals; and wherein
   a delay time of the even number of delay cells is varied to generate the even number of delay clock signals in response to the supply voltage, the even number of delay clock signals having the same period as a period of the external clock signal.

21. The semiconductor memory device of claim 20, wherein the period portion controller includes,
   a period portion phase detector configured to compare the phase of the external clock signal and the phase of the one delay clock signal, configured to generate the period portion up signal if the phase of the external clock signal is in advance of the phase of the one delay clock signal, and configured to generate the period portion down signal if the phase of the one delay clock signal is in advance of the phase of the external clock signal;
   a charge pump configured to increase the level of the supply voltage in response to the period portion up signal and configured to reduce the level of the supply voltage in response to the period portion down signal; and
   a pulse generator configured to detect at least one of a rising edge or a falling edge of the external clock signal to generate the pulse signal.

22. The semiconductor memory device of claim 21, wherein the delay further includes,
   a first selector configured to select one control signal among an even number of control signals and one inverted control signal among an even number of inverted control signals in response to the even number of first selecting signals and the pulse signal; and
   a delay circuit including the even number of delay cells, each of the delay cells including an inverter, each inverter including first and second pull-up transistors and first and second pull-down transistors connected between the supply voltage and a ground voltage, wherein the even number of inverted control signals are applied to gates of the first pull-up transistors and the even number of control signals are applied to gates of the pull-down transistors.

23. A method of generating a plurality of delay clock signals, the method comprising:
   controlling transition of at least one delay clock signal of an even number of delay clock signals in response to an activated one first selecting signal of an even number of first selecting signals;
   transitioning the remaining clock signals in response to the at least one delay clock signal;

comparing a phase of an input clock signal and a phase of one delay clock signal of the even number of delay lock signals to generate period up and down signals;

detecting at least one of a rising edge and a falling edge of the input clock signal to generate a pulse signal;

varying a first control signal in response to the period up and down signals to adjust a delay time of the even number of delay clock signals;

varying a level of a supply voltage in response to the first control signal; and selecting one second control signal of an even number of second control signals and one inverted second control signal among an even number of inverted second control signals in response to the even number of first selecting signals and the pulse signal, wherein the controlling transition of at least one delay clock signal step is performed in response to the one second control signal and the one inverted second control signal.

24. The method of claim 23, wherein the even number of delay clock signals having a same period as a period of the input clock signal.

25. The method of claim 24, further comprising:

generating the period up signal if the phase of the input clock signal is in advance of the phase of the one delay clock signal and generating the period down signal if the phase of the one delay clock signal is in advance of the phase of the input clock signal;

increasing the first control signal in response to the period up signal and reducing the first control signal in response to the period down signal.

26. The method of claim 23, further comprising:

delaying one output clock signal of an even number of output clock signals in a compensation delay time to generate a delayed output clock signal;

comparing a phase of the input clock signal and a phase of the delayed output clock signal to generate delay up and down signals;

varying a selecting and weight control signal in response to the delay up and down signals;

generating the even number of first selecting signals based on the delay up and down signals;

generating corresponding delay clock signals two by two from the even number of delay clock signals in response to the selecting and weight control signal and mixing the phases of the selected two delay clock signals to generate the even number of output clock signals.

27. The method of claim 23, further comprising:

varying a supply voltage in response to the period up and down signals to adjust a delay time of the even number of delay clock signals, the even number of delay clock signals having a same period as a period of the input clock signal.

28. The method of claim 27, further comprising:

generating the period up signal if the phase of the input clock signal is in advance of the phase of the one delay clock signal and generating the period down signal if the phase of the one delay clock signal is in advance of the phase of the input clock signal;

increasing a level of the supply voltage in response to the period up signal and decreasing the level of the supply voltage in response to the period down signal.

29. The method of claim 28, further comprising:

selecting one control signal of an even number of control signals and one inverted control signal of an even number of inverted control signals in response to the even number of first selecting signals and the pulse signal; and wherein the controlling transition of at least one delay clock signal step is performed in response to the one control signal and the one inverted control signal.

* * * * *